(12) United States Patent
Tashiro

(10) Patent No.: US 10,297,625 B2
(45) Date of Patent: May 21, 2019

(54) PHOTOELECTRIC CONVERSION DEVICE AND IMAGING SYSTEM

(71) Applicant: CANON KABUSHIKI KAISHA, Tokyo (JP)

(72) Inventor: Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/821,083

(22) Filed: Nov. 22, 2017

(65) Prior Publication Data

US 2018/0151608 A1    May 31, 2018

(30) Foreign Application Priority Data

Nov. 30, 2016   (JP) ................. 2016-233211

(51) Int. Cl.
| H04N 5/374 | (2011.01) |
| H04N 5/378 | (2011.01) |
| H04N 5/369 | (2011.01) |
| H01L 27/146 | (2006.01) |

(52) U.S. Cl.
CPC .... H01L 27/1461 (2013.01); H01L 27/14643 (2013.01); H04N 5/374 (2013.01); H04N 5/378 (2013.01)

(58) Field of Classification Search
CPC ...... H04N 5/374; H04N 5/378; H04N 5/3741; H04N 5/3698; H01L 27/14647; H01L 27/1461; H01L 27/14643
USPC ........... 348/294–324; 257/291, 292, 53, 126, 257/128, 443, 432, 444, E31.122; 250/208.1, 214.1; 438/93, 157, 161, 176, 438/196, 223, 227, 618

See application file for complete search history.

(56) References Cited

U.S. PATENT DOCUMENTS

| 6,075,256 A * | 6/2000 | Kaifu ................ H01L 27/146 257/53 |
| 9,571,768 B2 * | 2/2017 | Tashiro ................ H04N 5/3741 |
| 10,027,915 B2 * | 7/2018 | Tashiro ................ H04N 5/3575 |
| 10,091,444 B2 * | 10/2018 | Hashimoto ....... H01L 27/14647 250/208.1 |
| 2007/0076093 A1 | 4/2007 | Misawa |

(Continued)

FOREIGN PATENT DOCUMENTS

| JP | 2007104113 A | 4/2007 |
| JP | 201171486 A | 4/2011 |

(Continued)

*Primary Examiner* — Marly S Camargo
(74) *Attorney, Agent, or Firm* — Canon U.S.A., Inc. IP Division

(57) ABSTRACT

A photoelectric conversion device includes a blocking unit located between a photoelectric conversion layer and a second electrode unit and configured to cause electric charge having a first polarity to be injected from the photoelectric conversion layer into the second electrode unit and to prevent electric charge having a second polarity opposite to the first polarity from being injected from the photoelectric conversion layer into the second electrode unit, and a voltage supply unit configured to supply a second voltage to one of a first electrode unit and the second electrode unit such that electric charge having the first polarity is prevented from being injected from the photoelectric conversion layer into the second electrode unit.

20 Claims, 15 Drawing Sheets

(56) References Cited

U.S. PATENT DOCUMENTS

| | | | | |
|---|---|---|---|---|
| 2008/0035965 A1* | 2/2008 | Hayashi | ............... | H01L 31/00 257/291 |
| 2009/0308458 A1* | 12/2009 | Aramaki | ............... | H01L 51/42 257/53 |
| 2010/0060769 A1* | 3/2010 | Inuiya | ............... | H01L 27/14623 348/311 |
| 2010/0127342 A1* | 5/2010 | Mabuchi | ............... | H01L 27/146 257/445 |
| 2011/0052853 A1 | 3/2011 | Sugo | | |
| 2012/0080675 A1* | 4/2012 | Nakatani | ............... | H01L 27/307 257/53 |
| 2014/0146211 A1* | 5/2014 | Mori | ............... | H04N 5/3742 348/308 |
| 2015/0325606 A1* | 11/2015 | Togashi | ............... | H01L 27/0464 250/208.1 |
| 2016/0037116 A1* | 2/2016 | Hashimoto | ............... | H04N 5/3742 348/308 |
| 2018/0249104 A1* | 8/2018 | Sasago | ............... | H04N 5/35563 |

FOREIGN PATENT DOCUMENTS

| | | |
|---|---|---|
| JP | 201686407 A | 5/2016 |
| JP | 2016219849 A | 12/2016 |

\* cited by examiner

PHOTOELECTRIC CONVERSION MODE

MODE B

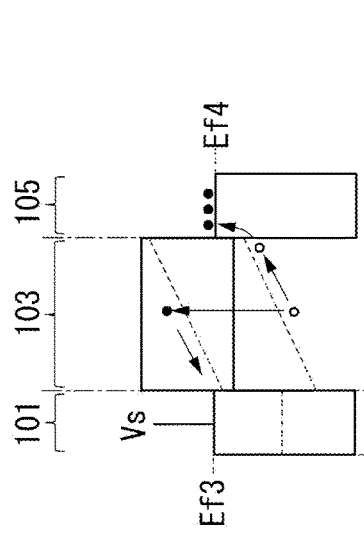
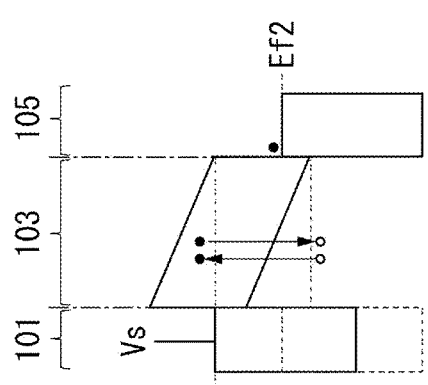
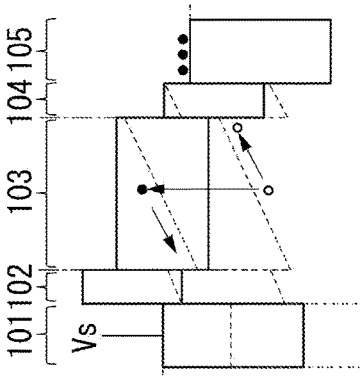
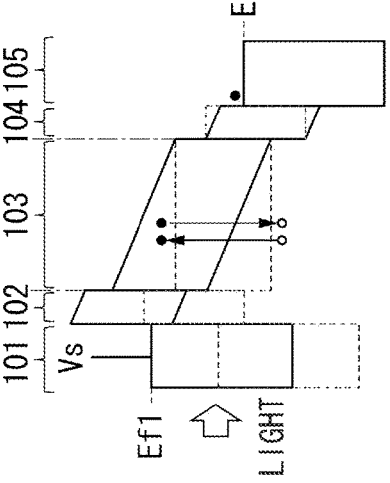
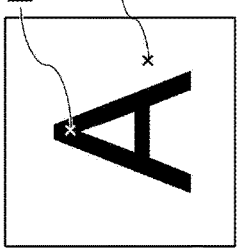

PHOTOELECTRIC CONVERSION MODE

MODE B

PHOTOELECTRIC CONVERSION MODE

MODE B

PHOTOELECTRIC CONVERSION DEVICE AND IMAGING SYSTEM

BACKGROUND OF THE INVENTION

Field of the Invention

Aspects of the embodiments generally relate to a photoelectric conversion device and an imaging system.

Description of the Related Art

As a photoelectric conversion device, for example, used for an image sensor of a camera, there is proposed what is called a stack type photoelectric conversion device, in which a photoelectric conversion layer is stacked above a semiconductor substrate.

Japanese Patent Application Laid-Open No. 2016-86407 discusses such a stack type photoelectric conversion device. In the photoelectric conversion device, an upper electrode shared by a plurality of pixels is located on the photoelectric conversion layer, and a pixel electrode and an auxiliary electrode are located under the photoelectric conversion layer. According to the discussion in Japanese Patent Application Laid-Open No. 2016-86407, the sensitivity of the photoelectric conversion layer can be adjusted by controlling a voltage applied to the auxiliary electrode. Furthermore, according to the illustration in FIG. 11 of Japanese Patent Application Laid-Open No. 2016-86407, the generation of signal electric charge in the photoelectric conversion layer can be prevented by controlling voltages applied to the upper electrode and the auxiliary electrode. Thus, according to the discussion in Japanese Patent Application Laid-Open No. 2016-86407, an electronic shutter operation can be implemented.

SUMMARY OF THE INVENTION

According to an aspect of the embodiments, a photoelectric conversion device includes a semiconductor substrate and a pixel, wherein the pixel includes a first electrode unit, a second electrode unit located between the first electrode unit and the semiconductor substrate, a photoelectric conversion layer located between the first electrode unit and the second electrode unit, a blocking unit located between the photoelectric conversion layer and the second electrode unit and configured to cause electric charge having a first polarity to be injected from the photoelectric conversion layer into the second electrode unit and to prevent electric charge having a second polarity opposite to the first polarity from being injected from the photoelectric conversion layer into the second electrode unit, and a voltage supply unit configured to supply a first voltage to one of the first electrode unit and the second electrode unit such that electric charge having the first polarity is injected from the photoelectric conversion layer into the second electrode unit, and configured to supply a second voltage to the one of the first electrode unit and the second electrode unit such that electric charge having the first polarity is prevented from being injected from the photoelectric conversion layer into the second electrode unit.

Further features of the disclosure will become apparent from the following description of exemplary embodiments with reference to the attached drawings.

BRIEF DESCRIPTION OF THE DRAWINGS

FIGS. 8A, 8B, 8C, 8D, and 8E illustrate energy band states corresponding to the luminance of an object and an operation of the photoelectric conversion unit.

DESCRIPTION OF THE EMBODIMENTS

An imaging scene may contain objects with various luminance values. The amount of electric charge retained by a pixel electrode varies for each pixel depending on different luminance values of objects contained in the imaging scene. Accordingly, the electric potential of a pixel electrode differs from pixel to pixel. In an electronic shutter operation discussed in Japanese Patent Application Laid-Open No. 2016-86407, the electric potential of a pixel electrode differs from pixel to pixel. As a result, in the photoelectric conversion device discussed in Japanese Patent Application Laid-Open No. 2016-86407, the electronic shutter operation may be unable to be appropriately performed in some pixels.

Aspects of the embodiments are generally directed to providing a photoelectric conversion device having a configuration enabling an appropriate electronic shutter operation even in a case where the electric potential of a pixel electrode differs from pixel to pixel.

According to one exemplary embodiment, a photoelectric conversion device is provided. The photoelectric conversion device includes a semiconductor substrate and a photoelectric conversion layer stacked on the semiconductor substrate. The photoelectric conversion layer is configured to photoelectrically convert light incident on the photoelectric conversion layer into electric charge. Furthermore, the photoelectric conversion layer does not need to have a photoelectric conversion function in whole. The semiconductor substrate is provided with a circuit unit configured to receive a signal which is based on signal electric charge generated in the photoelectric conversion layer. In some exemplary embodiments, the photoelectric conversion device includes a plurality of pixels. In these exemplary embodiments, a plurality of circuit units is arranged in association with the plurality of pixels. Each of the plurality of circuit units can include an amplifying unit, which amplifies a signal, and an analog-to-digital (AD) conversion unit, which converts a signal into a digital signal.

Figure 3A:
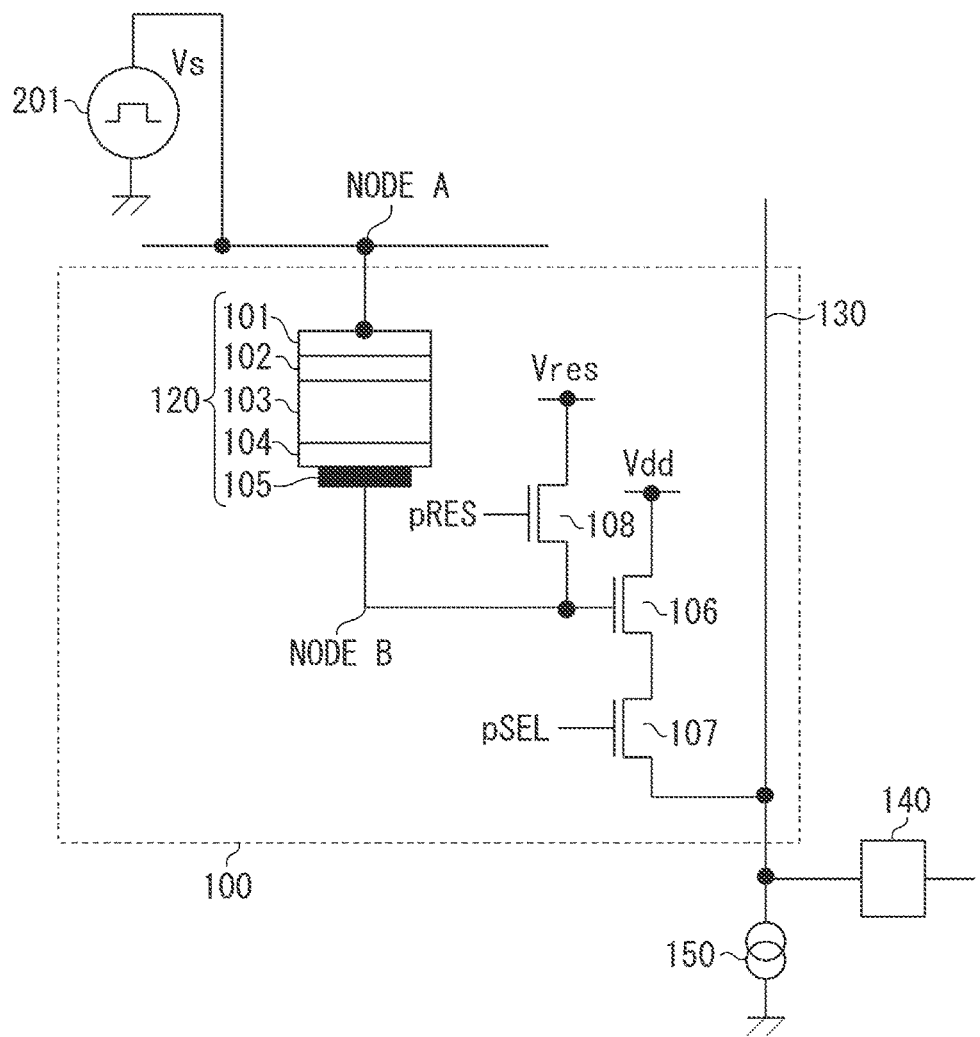
FIGS. 3A and 3B illustrate a circuit configuration of a pixel.

One exemplary embodiment is described with reference to FIG. 3A. Furthermore, FIG. 3A is also described in detail in an exemplary embodiment described below. A pixel 100 includes a first blocking layer 104 between a pixel electrode 105 and a photoelectric conversion layer 103. The first blocking layer 104 can be formed of a semiconductor material. The semiconductor material can be selected from among an inorganic semiconductor material, such as silicon, germanium, and gallium arsenide, and an organic semiconductor material. Moreover, a semiconductor material used to form the photoelectric conversion layer 103 and a semiconductor material used to form the first blocking layer 104 can be different from each other. Alternatively, a band gap of the semiconductor material used to form the photoelectric conversion layer 103 and a band gap of the semiconductor material used to form the first blocking layer 104 can be different from each other. The band gap is a difference between the lowest energy level of the conduction band and the highest energy level of the valence band. Furthermore, the material used to form the first blocking layer 104 is not limited to semiconductor materials.

Moreover, the photoelectric conversion layer 103 and the first blocking layer 104 can be formed of the same semiconductor material. In this case, the photoelectric conversion layer 103 and the first blocking layer 104 can be formed while causing the concentration of an impurity added to the semiconductor material to differ between the photoelectric conversion layer 103 and the first blocking layer 104.

Various exemplary embodiments, features, and aspects of the disclosure will be described in detail below with reference to the drawings. The disclosure is not limited to only the exemplary embodiments described below. Modification examples in which a configuration of a part of the exemplary embodiments described below is modified or altered within a range not exceeding the gist of the disclosure are also exemplary embodiments of the disclosure. Moreover, an example in which a configuration of a part of any exemplary embodiment described below is added to another exemplary embodiment or an example in which a configuration of a part of any exemplary embodiment described below is replaced by a configuration of a part of another exemplary embodiment is also an exemplary embodiment of the disclosure.

<Configuration of Photoelectric Conversion Device>

Figure 1:
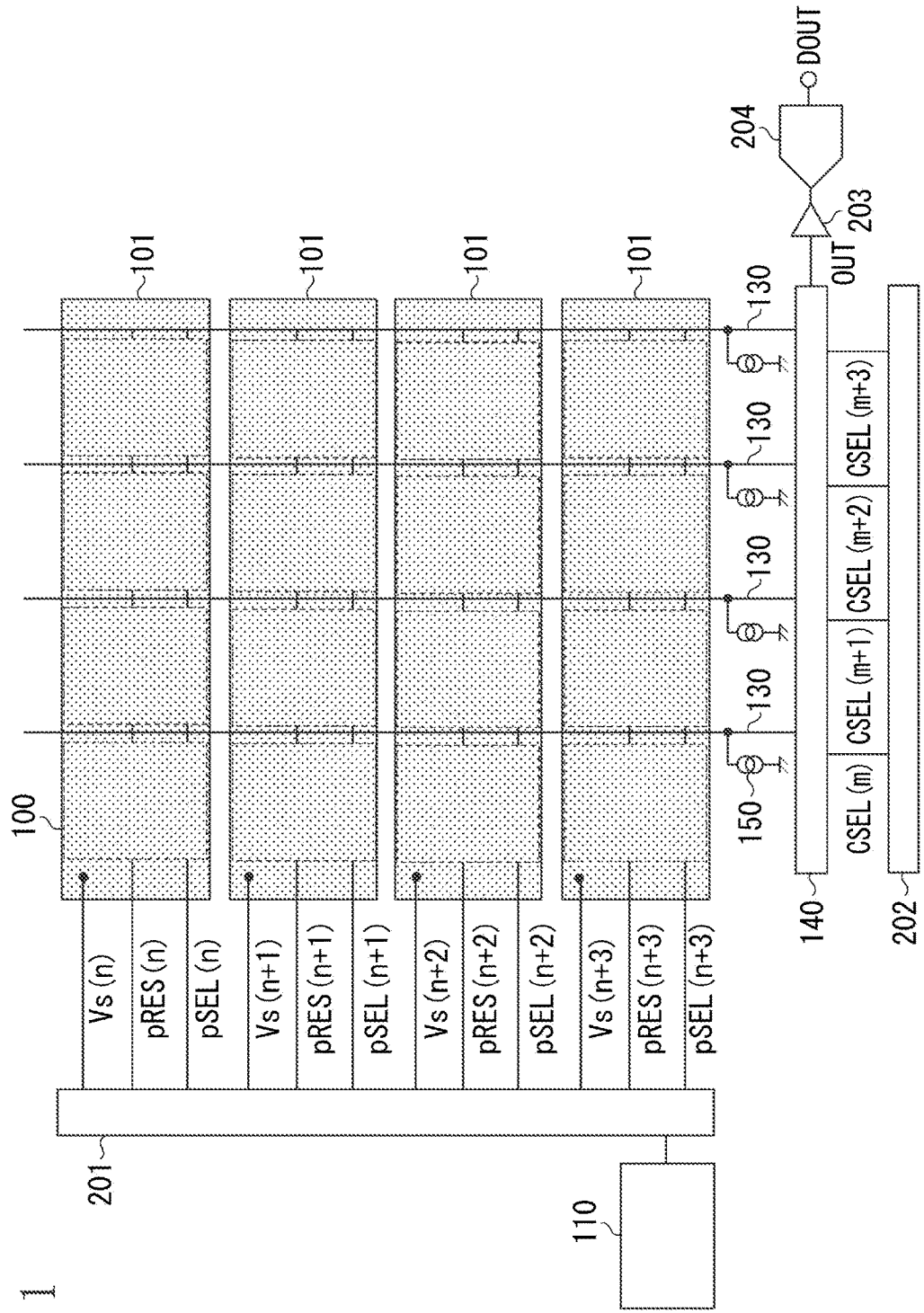
FIG. 1 illustrates a configuration of a photoelectric conversion device.

FIG. 1 illustrates a circuit configuration of the entirety of a photoelectric conversion device according to a first exemplary embodiment and an arrangement layout of upper electrodes 101 in combination.

In FIG. 1, 16 pixels 100 which are arranged as a matrix with 4 rows and 4 columns are illustrated. While, in the first exemplary embodiment, a matrix with 4 rows and 4 columns is described, the number of rows and the number of columns are not limited to these. A plurality of pixels 100 included in one column is connected to one output line 130. One current source 150 is connected to one output line 130. The current source 150 supplies current to the pixel 100. The pixel 100 outputs a pixel signal to the output line 130. The pixel signal includes a photo signal, which is a signal generated based on incident light, and a noise signal, which mainly contains a nose component of the pixel 100.

The photoelectric conversion device further includes a reference voltage supply unit 110 and a row drive circuit 201. The reference voltage supply unit 110 supplies a reference voltage used to generate voltages Vs which the row drive circuit 201 supplies. The row drive circuit 201 supplies an electrode drive voltage Vs, a reset signal pRES, and a drive signal pSEL. A plurality of pixels 100 included in one row is connected to a common reset signal line and a common drive signal line. The reset signal line is a wiring line used to transmit the reset signal pRES. The drive signal line is a wiring line used to transmit the drive signal pSEL.

Furthermore, in FIG. 1, to differentiate drive signals to be supplied to different rows, reference characters indicating rows, such as (n) and (n+1), are appended to the respective ends of the signal names. This also applies to the other figures.

FIG. 1 schematically illustrates a planar structure of the upper electrodes 101. One upper electrode 101 is provided in association with the pixels 100 included in one row. In the first exemplary embodiment, the upper electrode 101 is provided for each row. The row drive circuit 201 supplies voltages Vs on a row-by-row basis. The voltages Vs include a first voltage and a second voltage which is different in voltage value from the first voltage. The row drive circuit 201 is a voltage supply unit which supplies a plurality of voltages different in value to the upper electrodes 101. Furthermore, to differentiate voltages Vs to be supplied to different rows, reference characters indicating rows, such as (n) and (n+1), are appended to the voltage name Vs.

The photoelectric conversion device further includes a column circuit 140. While, in FIG. 1, column circuits 140 for a plurality of columns are simply illustrated as one block, actually, one column circuit 140 is configured to be provided for one output line 130.

A column drive circuit 202 supplies drive signals CSEL to a plurality of column circuits 140. The column drive circuit 202 sequentially sets the drive signals CSEL to an active level for each column circuit 140. With this, the column drive circuit 202 drives the column circuits 140 for each column. Furthermore, to differentiate drive signals to be supplied to different columns, reference characters indicating columns, such as (m) and (m+1), are appended to the respective ends of the signal name CSEL. This also applies to the other figures.

The column drive circuit 202 causes respective signals to be output from the plurality of column circuits 140 to an output amplifier unit 203. The output amplifier unit 203 amplifies the input signal and outputs the amplified signal to an AD conversion unit 204. The AD conversion unit 204 converts the input signal into a digital signal and outputs the digital signal as a signal DOUT to outside the photoelectric conversion device.

<Configuration of Column Circuit>

Figure 2:
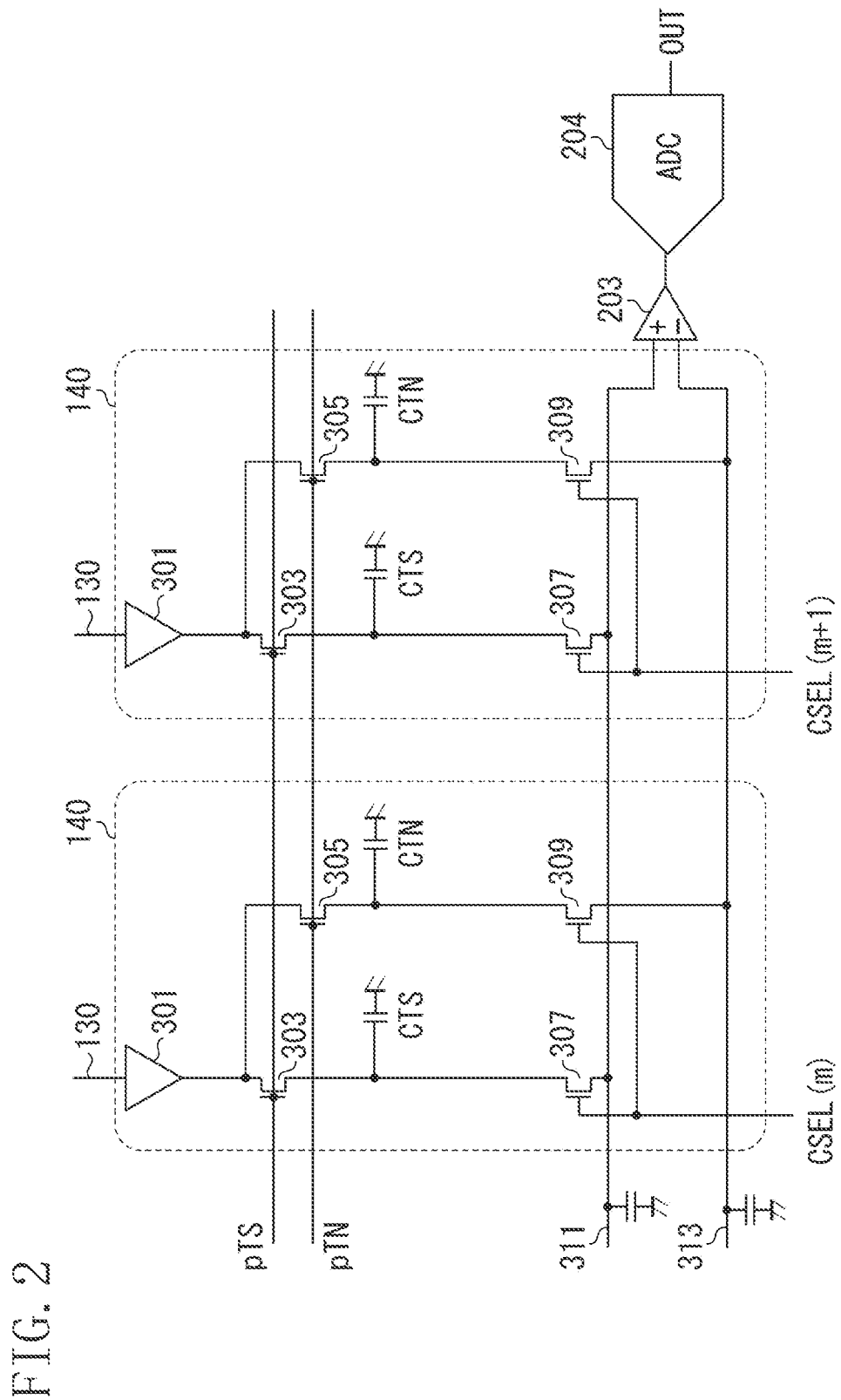
FIG. 2 illustrates a circuit configuration of a column circuit and a subsequent circuit following the column circuit.

FIG. 2 illustrates equivalent circuits of the column circuits 140 in the m-th column and (m+1)-th column. The column circuits 140 illustrated in FIG. 2 correspond to two columns of the column circuit 140 illustrated in FIG. 1.

A pixel signal output to the output line 130 is amplified by a column amplifier 301. The output node of the column amplifier 301 is connected to a capacitance CTS via a sample-and-hold (S/H) switch 303. Moreover, the output node of the column amplifier 301 is connected to a capacitance CTN via an S/H switch 305. The S/H switch 303 and the S/H switch 305 are controlled by a drive signal pTS and a drive signal pTN, respectively, which are output from a timing generator (not illustrated). With this configuration, the capacitance CTN retains a signal which is based on a noise signal output from the pixel 100. Moreover, the capacitance CTS retains a photo signal which contains a noise signal as a part of the component.

The capacitance CTS is connected to a horizontal output line 311 via a horizontal transfer switch 307. The capacitance CTN is connected to a horizontal output line 313 via a horizontal transfer switch 309. The horizontal transfer switches 307 and 309 are controlled by the drive signal CSEL output from the column drive circuit 202.

Each of the horizontal output line 311 and the horizontal output line 313 is connected to the output amplifier unit 203.

The output amplifier unit 203 outputs a difference between a signal from the horizontal output line 311 and a signal from the horizontal output line 313 to the AD conversion unit 204. The output amplifier unit 203 obtains a difference between the photo signal and the noise signal. This enables obtaining a signal obtained by subtracting the noise signal included in the photo signal from the photo signal. The AD conversion unit 204 converts a signal output from the output amplifier unit 203 into a digital signal.

Furthermore, in this example, a configuration in which a signal horizontally transferred from the column circuit 140 is AD converted is employed. As another example, the column circuit 140 of each column can be provided with an AD conversion unit. In this case, the AD conversion unit includes a retention unit which retains a digital signal corresponding to a pixel signal, such as a memory or counter. The noise signal and the photo signal are converted into respective digital signals and are then retained in the retention unit.

<Configuration of Pixel>

Figure 3B:
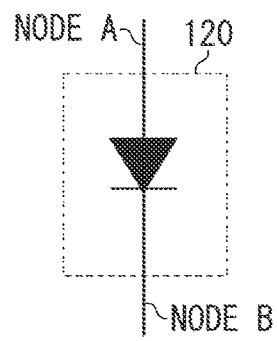

FIG. 3A illustrates an equivalent circuit of the pixel 100 in the photoelectric conversion device and a schematic view of the photoelectric conversion unit 120 in combination. FIG. 3B illustrates an equivalent circuit of the photoelectric conversion unit 120.

The pixel 100 illustrated in FIG. 3A corresponds to the pixel 100 illustrated in FIG. 1.

The pixel 100 includes the photoelectric conversion unit 120, an amplifying transistor (SF MOS) 106, a selection transistor (SEL MOS) 107, and a reset transistor (RES MOS) 108.

The photoelectric conversion unit 120 includes an upper electrode 101, a photoelectric conversion layer 103, and a pixel electrode 105. Furthermore, the photoelectric conversion unit 120 includes a first blocking layer 104 between the photoelectric conversion layer 103 and the pixel electrode 105. Moreover, the photoelectric conversion unit 120 includes a second blocking layer 102 between the photoelectric conversion layer 103 and the upper electrode 101.

A voltage Vs is supplied from the row drive circuit 201 to the upper electrode 101.

The node B illustrated in FIG. 3A is connected to the gate of the amplifying transistor 106. Moreover, the node B is connected to the source of the reset transistor 108. The drain of the reset transistor 108 is connected to a node to which a reset voltage Vres (for example, assumed to be 3.3 V, which is equal to a power source voltage Vdd described below) is supplied. The gate of the amplifying transistor 106 is an input node of the pixel amplifying unit. With this configuration, the pixel amplifying unit amplifies a signal from the photoelectric conversion unit 120 and outputs the amplified signal to the output line 130.

The drain of the amplifying transistor 106 is connected to a node to which the power source voltage Vdd (for example, 3.3 V) is supplied. The source of the amplifying transistor 106 is connected to the output line 130 via the selection transistor 107. The selection transistor 107 turning on allows a current to be supplied from a current source 150 to the amplifying transistor 106 via the output line 130 and the selection transistor 107. With this, a source follower circuit is configured with the amplifying transistor 106 and the current source 150. The amplifying transistor 106, which configures the source follower circuit, outputs, to the output line 130, a signal corresponding to the signal output from the photoelectric conversion unit 120. The signal output from the amplifying transistor 106 of the pixel 100 is input to the column circuit 140.

FIG. 3B illustrates an equivalent circuit of the photoelectric conversion unit 120. The photoelectric conversion unit 120 forms a photodiode having a first terminal connected to the node A illustrated in FIG. 3A and a second terminal connected to the node B. The node A is supplied with the voltage Vs from the row drive circuit 201.

<Planar Structure of Pixel>

Figure 4:
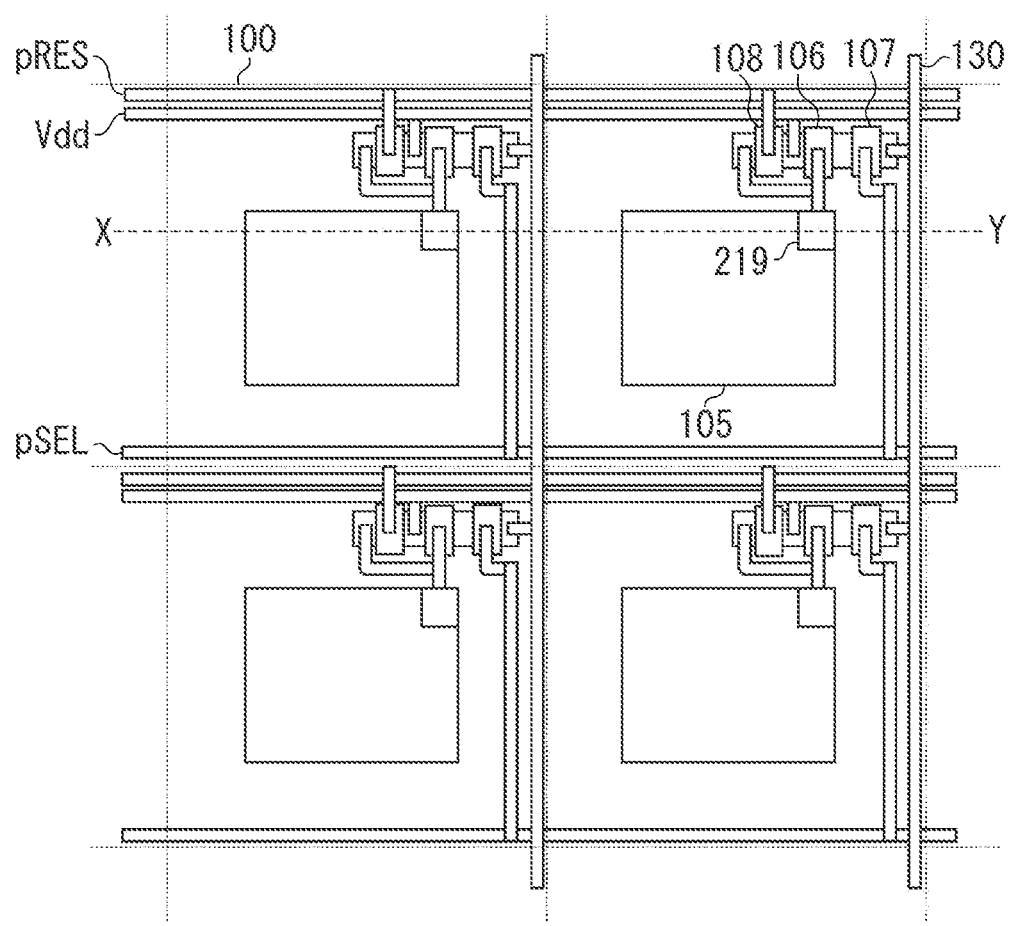
FIG. 4 illustrates a layout of pixels.

FIG. 4 schematically illustrates a planar structure of four pixels 100 arranged as a matrix with two rows and two columns. Each of the pixels 100 illustrated in FIG. 4 corresponds to the pixel 100 illustrated in FIG. 3A. In FIG. 4, members from the semiconductor substrate to the pixel electrode 105 are illustrated. Members stacked above the pixel electrode 105 are not illustrated.

Figure 5:
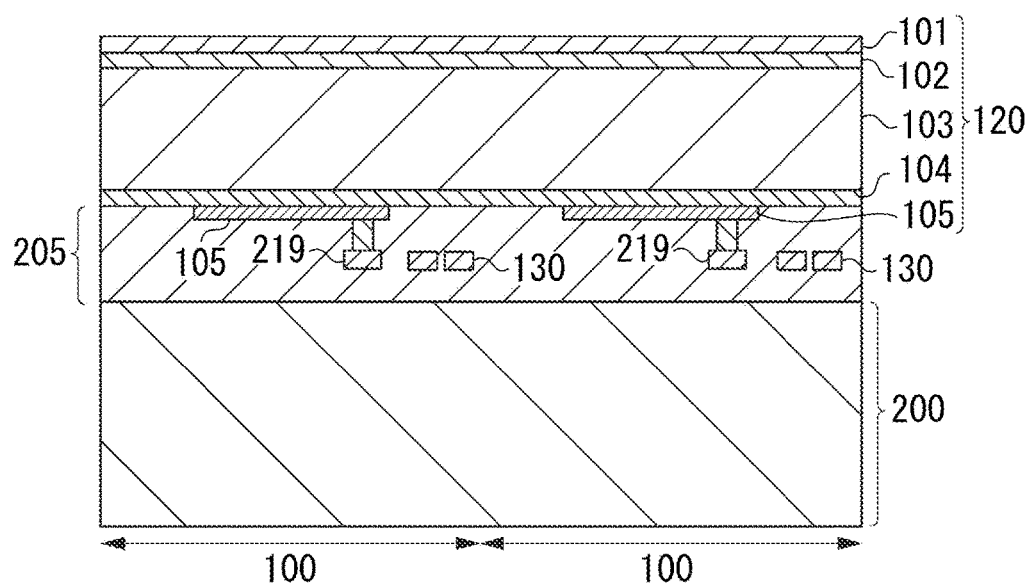
FIG. 5 illustrates a cross-section surface of a photoelectric conversion unit.

FIG. 5 schematically illustrates a cross-section structure of the pixel 100 of the photoelectric conversion device taken along a dashed line X-Y in FIG. 4.

In each of FIG. 4 and FIG. 5, members having the same functions as those of the members illustrated in FIG. 3A are assigned the respective same reference characters as the reference characters used in FIG. 3A. With regard to transistors, the corresponding gate electrodes are assigned the respective reference characters. FIG. 5 illustrates a cross-section structure of members from the semiconductor substrate 200 to the upper electrode 101.

The following description is made with reference to FIG. 4 and FIG. 5. The photoelectric conversion device includes the semiconductor substrate 200. The semiconductor substrate 200 is provided with an impurity semiconductor region (an impurity diffusion unit) (not illustrated), which includes sources and drains of pixel transistors. The pixel transistors respectively refer to the amplifying transistor 106, the selection transistor 107, and the reset transistor 108 illustrated in FIG. 3A. A plurality of wiring layers 205, which includes conductive members configuring the gates of the pixel transistors and the wiring lines, is arranged on the semiconductor substrate 200. The gate of the pixel transistor is typically formed of polysilicon. Each wiring line of the wiring layer 205 is typically formed of a conductive metal, such as aluminum or copper.

The upper electrode 101 is located above the semiconductor substrate 200. The pixel electrode 105 is located between the upper electrode 101 and the semiconductor substrate 200. The pixel electrode 105 is connected to the gate of the amplifying transistor 106 via a contact portion 219. Then, the photoelectric conversion layer 103 is located between the upper electrode 101 and the pixel electrode 105. The first blocking layer 104 is located between the photoelectric conversion layer 103 and the pixel electrode 105. The second blocking layer 102 is located between the upper electrode 101 and the photoelectric conversion layer 103.

The upper electrode 101 is electrically insulated for each row, as also illustrated in FIG. 1. On the other hand, as illustrated in FIG. 5, the pixel electrode 105 of each pixel 100 is electrically insulated from the pixel electrode 105 of another pixel 100. In this way, while the upper electrode 101 is formed over a plurality of pixels 100, the pixel electrode 105 is formed for each pixel.

<Functions of Photoelectric Conversion Unit and Electronic Shutter Operation>

Next, an operation of the pixel 100 and functions of the first blocking layer 104, the photoelectric conversion layer 103, and the second blocking layer 102 in the first exemplary embodiment are described in detail.

Figure 6:
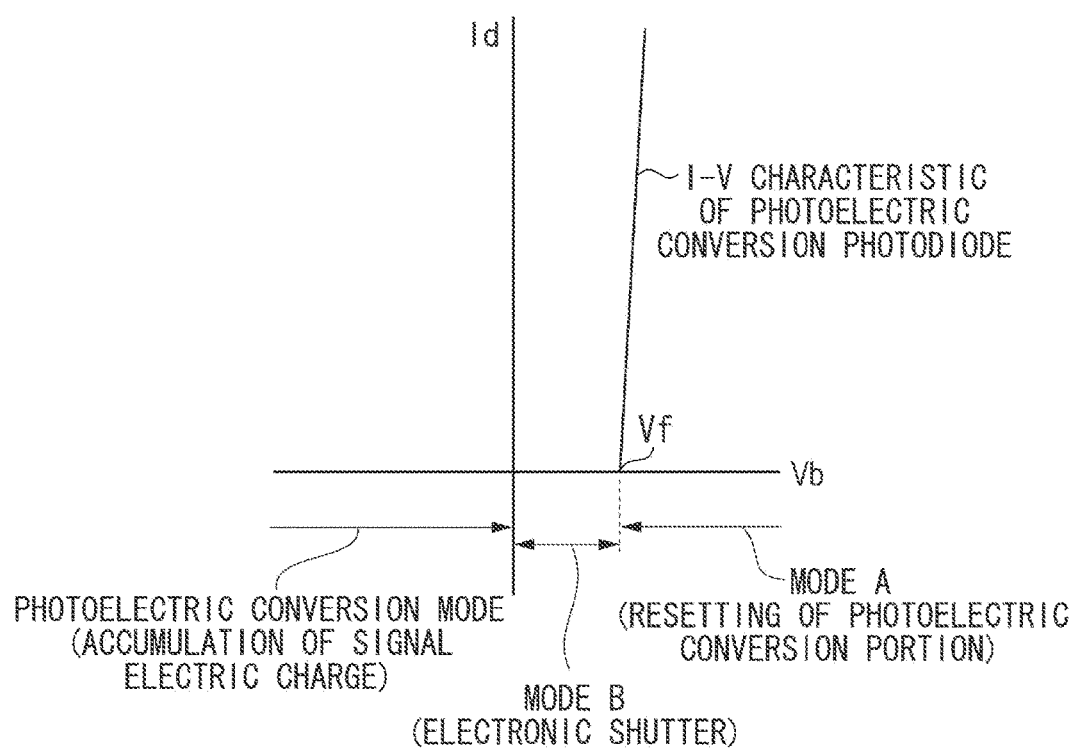
FIG. 6 illustrates an operation of the photoelectric conversion unit corresponding to a bias applied to the photoelectric conversion unit.

FIG. 6 illustrates a current-voltage characteristic (I-V characteristic) in a state in which no incident light falls on the photoelectric conversion unit 120 (in a dark state). In FIG. 6, the ordinate axis indicates a current Id flowing between the upper electrode 101 and the pixel electrode 105, and the abscissa axis indicates a voltage Vb applied to the photoelectric conversion unit 120. The voltage Vb is an electric potential difference between the upper electrode 101 and the pixel electrode 105. A voltage Vf is a rising voltage in the forward direction of the photodiode.

The magnitude relationship in electric potential between the upper electrode 101 and the pixel electrode 105 in a case where the photoelectric conversion unit 120 performs photoelectric conversion (in a photoelectric conversion mode) is a relationship in which a reverse bias is applied to the photoelectric conversion layer 103. When light falls on the photoelectric conversion layer 103, electrons and holes are generated in the photoelectric conversion layer 103. In a bias condition in the photoelectric conversion mode, electrons generated in the photoelectric conversion layer 103 move to the pixel electrode 105, and holes generated therein move to the upper electrode 101. The pixel electrode 105 accumulates the electrons generated in the photoelectric conversion layer 103.

In a mode A in which a forward bias is applied to the photoelectric conversion layer 103 and the voltage Vb is in a range higher than the rising voltage Vf, holes are injected from the upper electrode 101 into the photoelectric conversion layer 103.

In a mode B in which a forward bias is applied to the photoelectric conversion layer 103 and the voltage Vb is in a range lower than the rising voltage Vf, the photoelectric conversion unit 120 enters a state of performing an electronic shutter operation described below.

Figure 7A:
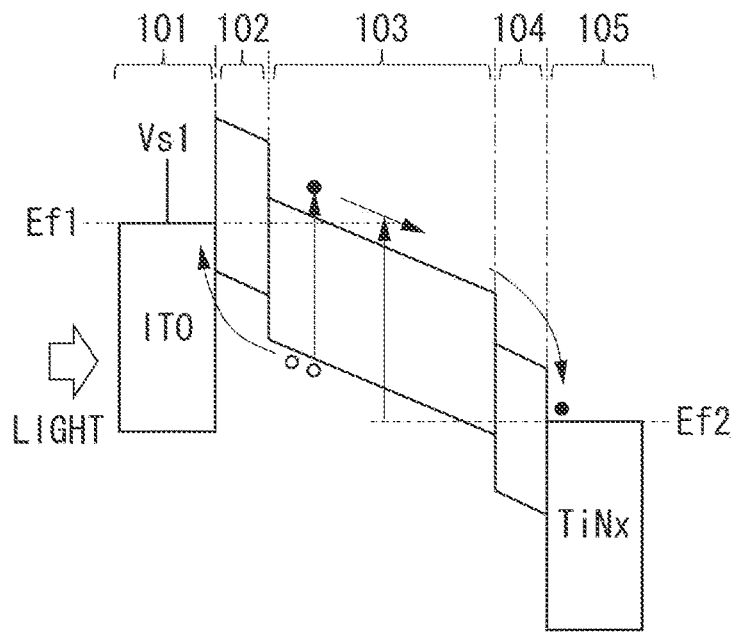
FIGS. 7A and 7B illustrate energy band states in an operation of the photoelectric conversion unit.
Figure 7B:
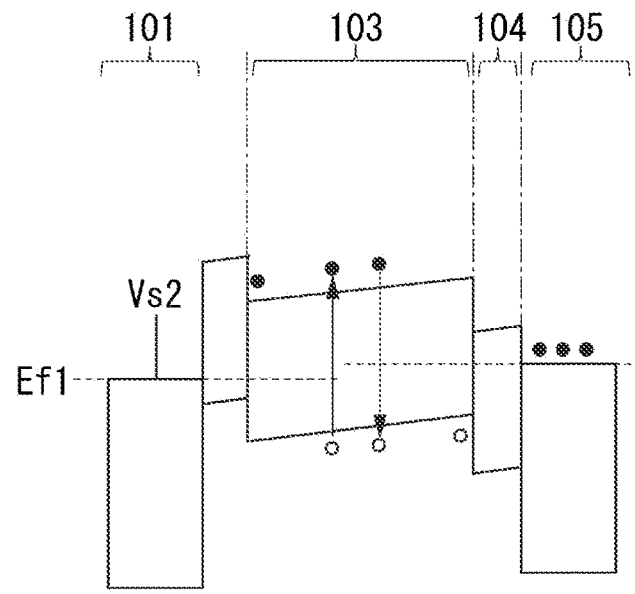

FIGS. 7A and 7B schematically illustrate bias conditions of voltages applied to the photoelectric conversion unit 120 and energy band structures in the photoelectric conversion unit 120 in these bias conditions. FIG. 7A corresponds to the photoelectric conversion mode (a mode in which the pixel electrode 105 accumulates signal electric charge) in FIG. 6. FIG. 7B corresponds to the mode B (a mode of performing electronic shutter) in FIG. 6. The ordinate axis in FIGS. 7A and 7B indicates a potential relative to an electron. Accordingly, the voltage becomes higher as the position goes toward the lower position in FIGS. 7A and 7B.

Each of FIGS. 7A and 7B illustrates energy bands of the upper electrode 101, the second blocking layer 102, the photoelectric conversion layer 103, the first blocking layer 104, and the pixel electrode 105. In FIG. 7A, as an example, a case where the upper electrode 101 is formed of indium tin oxide (ITO) and the pixel electrode 105 is formed of titanium nitride (TiNx) is illustrated. Hereinafter, also with regard to energy band diagrams illustrated in the other figures, unless otherwise stated, the materials of the upper electrode 101 and the pixel electrode 105 are the same as those illustrated in FIG. 7A.

The electric potential Ef1 illustrated in each of FIGS. 7A and 7B is the Fermi level of the upper electrode 101, and the electric potential Ef2 is the Fermi level of the pixel electrode 105. With regard to the second blocking layer 102, the photoelectric conversion layer 103, and the first blocking layer 104, a band gap between the conduction band and the valence band is illustrated.

FIG. 7A, which corresponds to the photoelectric conversion mode in FIG. 6, illustrates a potential in a state in which electrons serving as signal electric charge of the electric charge generated by a photoelectric conversion operation of the photoelectric conversion unit 120 are accumulated in the pixel electrode 105. An electron generated by photoelectric conversion is denoted by a filled circle, and a hole is denoted by an unfilled circle. To cause the photoelectric conversion unit 120 to enter the photoelectric conversion mode, the voltage Vs supplied to the upper electrode 101 is set to a voltage Vs1 (for example, 0 V), which is a first voltage. The photoelectric conversion layer 103, which is in the reverse bias state, is depleting.

Electrons serving as signal electric charge of the electric charge generated by the photoelectric conversion layer 103 move to the pixel electrode 105. During the photoelectric conversion mode, electrons generated by the photoelectric conversion layer 103 are progressively accumulated in the pixel electrode 105. The electric potential of the node B decreases according to the amount of signal electric charge accumulated in the pixel electrode 105. The decrease in electric potential of the node B causes the band structure of the photoelectric conversion layer 103 to change toward a flat band state.

Furthermore, the photoelectric conversion unit 120 is provided with the second blocking layer 102. This restricts injection of electrons from the upper electrode 101 into the photoelectric conversion layer 103. Therefore, it is possible to prevent the occurrence of a dark current, which would be generated by injection of electrons from the upper electrode 101 into the photoelectric conversion layer 103. Thus, the second blocking layer 102 is a second blocking unit configured to prevent injection of electrons, which are electric charge having the same polarity as that of signal electric charge, from the upper electrode 101 into the photoelectric conversion layer 103.

Holes generated by the photoelectric conversion layer 103 move toward the upper electrode 101 and are thus ejected to outside the photoelectric conversion unit 120.

The photoelectric conversion unit 120 is provided with the first blocking layer 104. This enables restricting injection of holes from the pixel electrode 105 into the photoelectric conversion layer 103. This also enables preventing the occurrence of recombination of holes and electrons in the photoelectric conversion layer 103. Therefore, a decrease in sensitivity which would occur due to injection of holes from the pixel electrode 105 into the photoelectric conversion layer 103 can be prevented. Thus, the first blocking layer 104 is a blocking unit configured to cause electrons serving as signal electric charge to be injected from the photoelectric conversion layer 103 into the pixel electrode 105, and to prevent injection of holes, which are electric charge having a polarity opposite to that of signal electric charge, from the photoelectric conversion layer 103 into the pixel electrode 105. Furthermore, the first electrode unit is the upper electrode 101, and the second electrode unit is the pixel electrode 105.

FIG. 7B illustrates a potential of the photoelectric conversion unit 120 which corresponds to the mode B in FIG. 6. In the mode B in FIG. 6, an electronic shutter operation is performed. A global electronic shutter can be implemented by all of the pixels 100 illustrated in FIG. 1 simultaneously performing each of the start of photoelectric conversion and the operation of shift from the photoelectric conversion mode to the mode B. To cause the photoelectric conversion unit 120 to enter the mode B, the voltage Vs supplied to the upper electrode 101 is set to a voltage Vs2 (for example, 3.3 V, the same as the voltage Vres), which is a second voltage. Since signal electric charge is electrons, the voltage Vs1 and the voltage Vs2 have a relationship of "Vs2>Vs1" with respect to electric potential.

In the mode B, the photoelectric conversion layer 103 is in a state close to the flat band state. In other words, injection of holes from the upper electrode 101 hardly occurs. Moreover, since a bias applied to the photoelectric conversion layer 103 is small, movement of holes generated by photoelectric conversion to the outside of the photoelectric conversion layer 103 hardly occurs. Movement of electrons generated by the photoelectric conversion layer 103 to the outside of the photoelectric conversion layer 103 also hardly occurs. Accordingly, a variation in the amount of electrons accumulated in the pixel electrode 105 hardly occurs. This state can be deemed to be a state in which electrons accumulated in the pixel electrode 105 are retained. Accordingly, in the pixel 100 in the first exemplary embodiment, the photoelectric conversion unit 120 shifts from the photoelectric conversion mode to the mode B, so that the electric charge accumulation period of the photoelectric conversion unit 120 ends.

The first blocking layer 104, the photoelectric conversion layer 103, and the second blocking layer 102 in the first exemplary embodiment can be made to configure a homojunction. Thus, the first blocking layer 104, the photoelectric conversion layer 103, and the second blocking layer 102 can be made to be formed of the same semiconductor material. The term "same semiconductor material" refers to respective elements which are most contained in the first blocking layer 104, the photoelectric conversion layer 103, and the second blocking layer 102 being the same. For example, suppose that the first blocking layer 104, the photoelectric conversion layer 103, and the second blocking layer 102 are respectively formed of semiconductors formed by adding an impurity to silicon. In this case, respective elements which are most contained in the first blocking layer 104, the photoelectric conversion layer 103, and the second blocking layer 102 are silicon. Accordingly, the first blocking layer 104, the photoelectric conversion layer 103, and the second blocking layer 102 can be said to be formed of the "same semiconductor material".

The material used to make the photoelectric conversion layer 103 includes a semiconductor material, a compound semiconductor, and an organic semiconductor. Examples of the semiconductor material include intrinsic amorphous silicon, low-concentration P-type amorphous silicon, and low-concentration N-type amorphous silicon. Examples of the compound semiconductor include a III-V group compound semiconductor, such as boron nitride (BN), gallium arsenide (GaAs), gallium phosphide (GaP), aluminum antimonide (AlSb), and gallium aluminum arsenide phosphide (GaAlAsP), and a II-VI group compound semiconductor, such as cadmium selenide (CdSe), zinc sulfide (ZnS), and cadmium telluride (CdTe). Examples of the organic semiconductor include a phthalocyanine-series material, such as fullerene, coumalin 6 (C6), rhodamine 6G (R6G), quinacridone, and zinc phthalocyanine (ZnPc), and a naphthalocyanine-series material.

Furthermore, a layer containing quantum dots configured with the above-mentioned semiconductor material can be used as the photoelectric conversion layer 103. An amorphous silicon film, an organic semiconductor film, and a quantum dot film are available to readily form a thin film. Here, the term "quantum dot" refers to a particle with a particle size of 20.0 nanometers (nm) or less.

Moreover, an intrinsic semiconductor is low in carrier density. Therefore, using the intrinsic semiconductor for the photoelectric conversion layer 103 enables attaining a wide depletion layer width. This enables implementing a photoelectric conversion layer 103 with a high sensitivity and with an improved noise-reduction effect.

The upper electrode 101 is formed of a material which allows light incident via a microlens layer (not illustrated) and a color filter layer (not illustrated) to pass through the upper electrode 101 and fall on the photoelectric conversion layer 103. For example, a transparent electrode of, for example, a compound or oxide containing indium and tin, such as ITO, can be used for the upper electrode 101. Since using the transparent electrode enables preventing a decrease in the amount of incident light due to passing through the upper electrode 101, a decrease in sensitivity of the photoelectric conversion unit 120 can be prevented or reduced. As another example of the upper electrode 101, a polysilicon material or metal having such a small thickness as to allow a predetermined amount of light to pass therethrough can be used as the upper electrode 101. Since metals are lower in electrical resistance than oxides, using a metal as the material of the upper electrode 101 enables a reduction in power consumption and an increase in speed of driving as compared with using an oxide as the material of the upper electrode 101.

In a case where the first blocking layer 104, the photoelectric conversion layer 103, and the second blocking layer 102 are respectively formed of the "same semiconductor materials", the concentrations of impurities contained in the respective semiconductor materials are set in such a way as to differ from each other. For example, the second blocking layer 102 is formed of a P-type semiconductor material, the photoelectric conversion layer 103 is formed of an intrinsic semiconductor, and the first blocking layer 104 is formed of an N-type semiconductor material. Thus, the conductivity type (type I) of the photoelectric conversion layer 103 and the conductivity type (type N) of the first blocking layer 104, which is a blocking unit, are different from each other. Moreover, the conductivity type (type N) of the first blocking layer 104 and the conductivity type (type P) of the second blocking layer 102 are different from each other.

Furthermore, the first blocking layer 104 can be formed of a material different from that of the photoelectric conversion layer 103. In the case of such a configuration, a heterojunction is formed between the first blocking layer 104 and the photoelectric conversion layer 103. A difference in material between the first blocking layer 104 and the photoelectric conversion layer 103 causes an energy barrier to be generated between the first blocking layer 104 and the photoelectric conversion layer 103. Accordingly, this heterojunction enables preventing (blocking) the injection of electric charge opposite in polarity to the signal electric charge from the photoelectric conversion layer 103 into the pixel electrode 105. Furthermore, the term "different material" as used herein refers to principal elements used to form the respective layers being different from each other.

<Beneficial Effect Obtained by Provision of First Blocking Layer 104>

An effect of the first exemplary embodiment is described with reference to each of FIGS. 8A to 8E. FIGS. 8B and 8C illustrate reference examples in a case where the photoelectric conversion unit 120 is not provided with the first blocking layer 104. FIGS. 8D and 8E illustrate examples in a case where the photoelectric conversion unit 120 is provided with the first blocking layer 104, as described above in the first exemplary embodiment.

FIG. 8A illustrates an image incident on the photoelectric conversion device. A photo signal of the pixel 100 located at position P1 is at a level close to a dark level, and a photo signal of the pixel 100 located at position P2 is at a level close to a saturation level. In this way, depending on an imaging scene, a pixel P1 close to a dark level and a pixel P2 close to a saturation level are present in a single image.

The reference examples illustrated in FIGS. 8B and 8C are described. FIG. 8B illustrates a band structure of the photoelectric conversion unit 120 in the pixel P1. FIG. 8C illustrates a band structure of the photoelectric conversion unit 120 in the pixel P2. Solid lines drawn in each of FIGS. 8B and 8C indicate a band structure in a photoelectric conversion region. Dashed lines drawn in each of FIGS. 8B and 8C indicate a band structure in the mode B.

In the photoelectric conversion unit 120 in the pixel P1 illustrated in FIG. 8B, during the photoelectric conversion mode, as indicated by solid lines, electrons caused by the photo signal are hardly accumulated in the pixel electrode 105. Therefore, in the photoelectric conversion mode, the band structure of the photoelectric conversion unit 120 in the pixel P1 remains at a potential close to a reverse bias state obtained at the time of resetting of the photoelectric conversion unit 120.

In the photoelectric conversion unit 120 in the pixel P2 illustrated in FIG. 8C, during the photoelectric conversion mode, as indicated by solid lines, electrons caused by the photo signal are accumulated in the pixel electrode 105, so that the electric potential of the node B is lowered. Therefore, in the photoelectric conversion mode, the band structure of the photoelectric conversion unit 120 in the pixel P2 is in a state close to a flat band state.

Here, suppose that the electric potential of the voltage Vs2 is set in such a manner that the pixel P1, which outputs a photo signal close to a dark level, exhibits a flat band in the mode B. Therefore, as indicated by dashed lines in FIG. 8B, in the mode B, the photoelectric conversion unit 120 in the pixel P1 is in a state close to a flat band state.

In the photoelectric conversion unit 120 in the pixel P2 illustrated in FIG. 8C, during the mode B, as indicated by dashed lines, the electric potential of the upper electrode 101 becomes relatively higher than the electric potential of the pixel electrode 105. Therefore, while the photoelectric conversion unit 120 is in the mode B, holes generated in the photoelectric conversion layer 103 become likely to move to the pixel electrode 105.

The holes generated in the photoelectric conversion layer 103 moving to the pixel electrode 105 cause electrons accumulated in the pixel electrode 105 to disappear. Therefore, the photo signal in the pixel P2 becomes at a signal level lower than a signal level to be originally output. With this, in an image generated by using signals output from the photoelectric conversion device, the luminance of a high-luminance portion is lowered. In other words, an image with contrast lowered as compared with an image assumed to be generated without disappearance of electrons accumulated in the pixel electrode 105 is generated.

The photoelectric conversion unit 120 in the first exemplary embodiment includes the first blocking layer 104.

FIG. 8D illustrates a band structure of the pixel P1 provided with the photoelectric conversion unit 120 in the first exemplary embodiment. In FIG. 8D, as with FIG. 8B, in the mode B, the photoelectric conversion unit 120 in the pixel P1 is in a state close to a flat band state.

In FIG. 8E, a band structure in a case where the photoelectric conversion unit 120 in the pixel P2 is in the mode B is indicated by dashed lines. The movement of holes generated in the photoelectric conversion layer 103 from the photoelectric conversion layer 103 to the pixel electrode 105 is prevented by the first blocking layer 104.

In this way, since the photoelectric conversion unit 120 includes the first blocking layer 104, the movement of holes generated in the photoelectric conversion layer 103 to the pixel electrode 105 is prevented. Therefore, the disappearance of electrons accumulated in the pixel electrode 105, which would occur in the case of FIG. 8C, is also prevented. Moreover, a decrease in signal level of the photo signal output from the pixel P2, which would occur in the case of FIG. 8C, is also prevented. With this, a decrease in luminance of a high-luminance portion in an image generated by using signals output from the photoelectric conversion device, which would occur in the case of FIG. 8C, is also prevented. Accordingly, the photoelectric conversion device according to the first exemplary embodiment has an effect capable of preventing a decrease in contrast of an image, which would occur in a conventional electronic shutter operation.

Furthermore, while, in the first exemplary embodiment, a case in which signal electric charge is electrons is described, a similar effect can be attained even in a case where signal electric charge is holes.

A photoelectric conversion device according to a second exemplary embodiment is described with reference to FIG. 1 and FIG. 9 mainly about portions different from those in the first exemplary embodiment.

The configuration of the photoelectric conversion device according to the second exemplary embodiment can be the same as that in the first exemplary embodiment.

In the photoelectric conversion device according to the second exemplary embodiment, the accumulation of signal electric charge in the photoelectric conversion unit 120 is assumed to be simultaneously started in all of the plurality of pixels 100 illustrated in FIG. 1. Moreover, the accumulation of signal electric charge in the photoelectric conversion unit 120 is assumed to be simultaneously ended in all of the plurality of pixels 100 illustrated in FIG. 1. Thus, the photoelectric conversion device according to the second exemplary embodiment can perform what is called a global electronic shutter operation.

Figure 9:
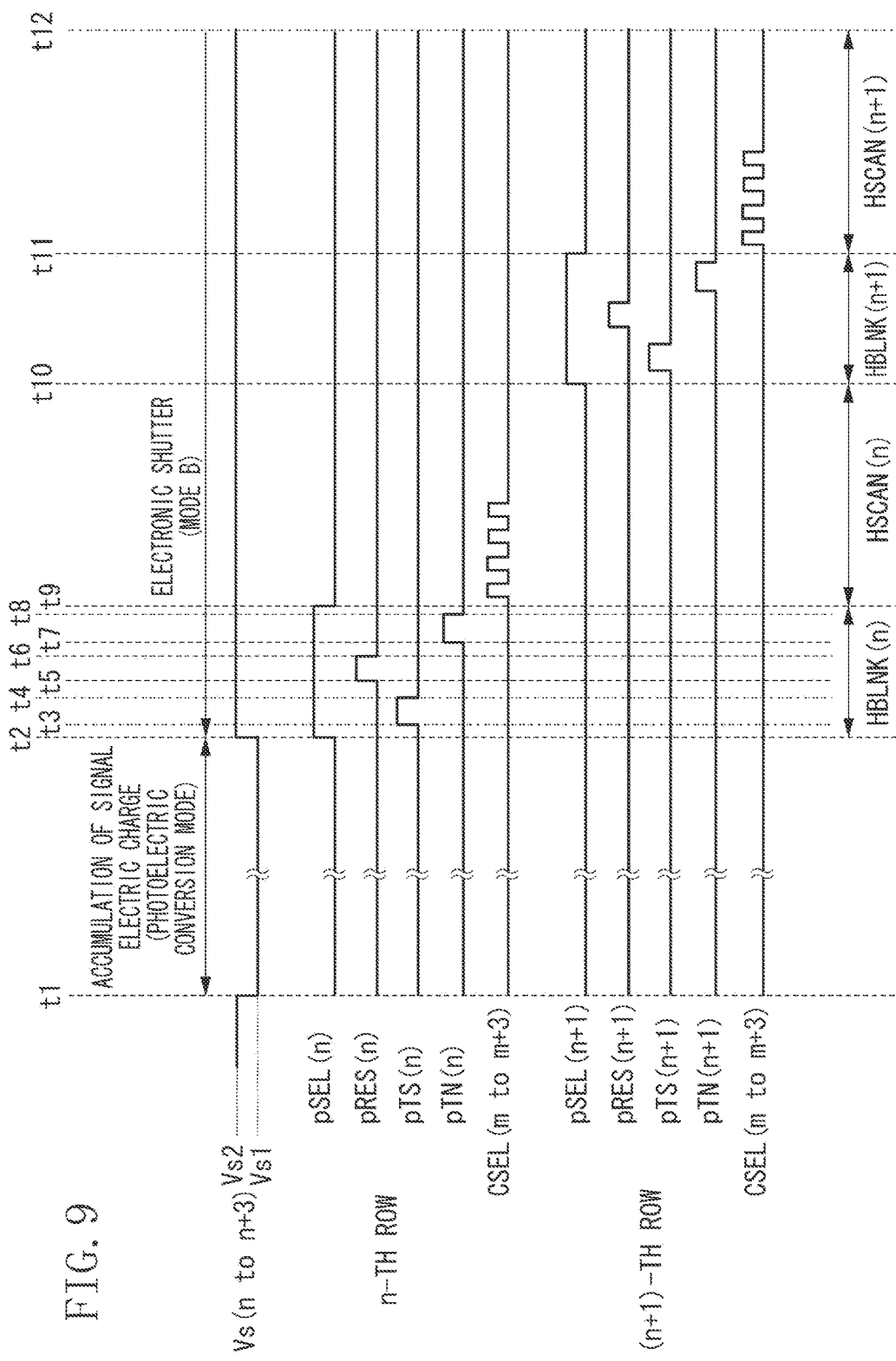
FIG. 9 illustrates an operation of the photoelectric conversion device.

FIG. 9 is a timing chart illustrating an operation of the photoelectric conversion device according to the second exemplary embodiment. Signals illustrated in FIG. 9 correspond to the respective signals illustrated in FIG. 1.

At time t1, the row drive circuit 201 changes the voltages Vs(n to n+3), which are applied to the pixels 100 in the n-th to (n+3)-th rows, from the voltage Vs2 to the voltage Vs1. With this, the photoelectric conversion units 120 of all of the pixels 100 illustrated in FIG. 1 shift to the photoelectric conversion mode. Although not illustrated, at time t1, the electric potential of the node B of each of all of the pixels 100 is at the reset level.

At time t2, the row drive circuit 201 changes the voltages Vs(n to n+3), which are applied to the pixels 100 in the n-th to (n+3)-th rows, from the voltage Vs1 to the voltage Vs2. With this, the photoelectric conversion units 120 of all of the pixels 100 illustrated in FIG. 1 shift to the mode B. Accordingly, in all of the pixels 100 illustrated in FIG. 1, during a period from time t1 to time t2, electric charge generated by the photoelectric conversion units 120 is retained in the node B.

Moreover, at time t2, the row drive circuit 201 sets the drive signal pSEL(n) to high level. With this, the selection transistors 107 of the pixels 100 in the n-th row are turned on. Accordingly, the amplifying transistors 106 of the pixels 100 in the n-th row output signals to the output lines 130.

At time t3, the timing generator sets the signal pTS(n) to high level. Then, at time t4, the timing generator sets the signal pTS(n) to low level. With this, the capacitance CTS of the column circuit 140 retains a signal S which is a photo signal containing the photo signal accumulated in the node B and a threshold variation of the amplifying transistor 106.

At time t5, the row drive circuit 201 sets the signal pRES(n) to high level. Then, at time t6, the row drive circuit 201 sets the signal pRES(n) to low level. With this, the electric potential of the node B becomes the electric potential of the reset level as at time t1.

At time t7, the timing generator sets the signal pTN(n) to high level. Then, at time t8, the timing generator sets the signal pTN(n) to low level. With this, the capacitance CTN of the column circuit 140 retains a signal N which is a noise signal containing a threshold variation of the amplifying transistor 106.

At time t9, the row drive circuit 201 sets the signal pSEL(n) to low level.

After that, the column drive circuit 202 sequentially sets the signals CSEL(m to m+3) for the column circuits 140 in the respective columns to high level. With this, the column circuits 140 in the respective columns sequentially output the signal S and the signal N to the output amplifier unit 203. The output amplifier unit 203 outputs a signal indicating a difference between the signal S and the signal N to the AD conversion unit 204.

After that, the row drive circuit 201, the timing generator, and the column drive circuit 202 sequentially perform, with respect to the pixels 100 in the other rows, operations performed on the pixels 100 in the n-th row during a period from time t2 to time t10.

Accordingly, the photoelectric conversion device according to the second exemplary embodiment is able to obtain a signal corresponding to incident light on each pixel 100. Moreover, the photoelectric conversion device according to the second exemplary embodiment is able to perform a global electronic shutter operation by causing the level of the voltage Vs to be shared by all of the pixels 100.

Moreover, in the second exemplary embodiment, a photoelectric conversion device including pixels 100 with four rows and four columns is described as an example. Actually, the pixels 100 of the photoelectric conversion device are formed with thousands of rows and thousands of columns. The global electronic shutter operation described in the second exemplary embodiment can be performed with respect to the pixels 100 arranged with thousands of rows and thousands of columns.

A photoelectric conversion device according to a third exemplary embodiment is described with reference to FIG. 10 mainly about portions different from those in the first exemplary embodiment.

Figure 10:
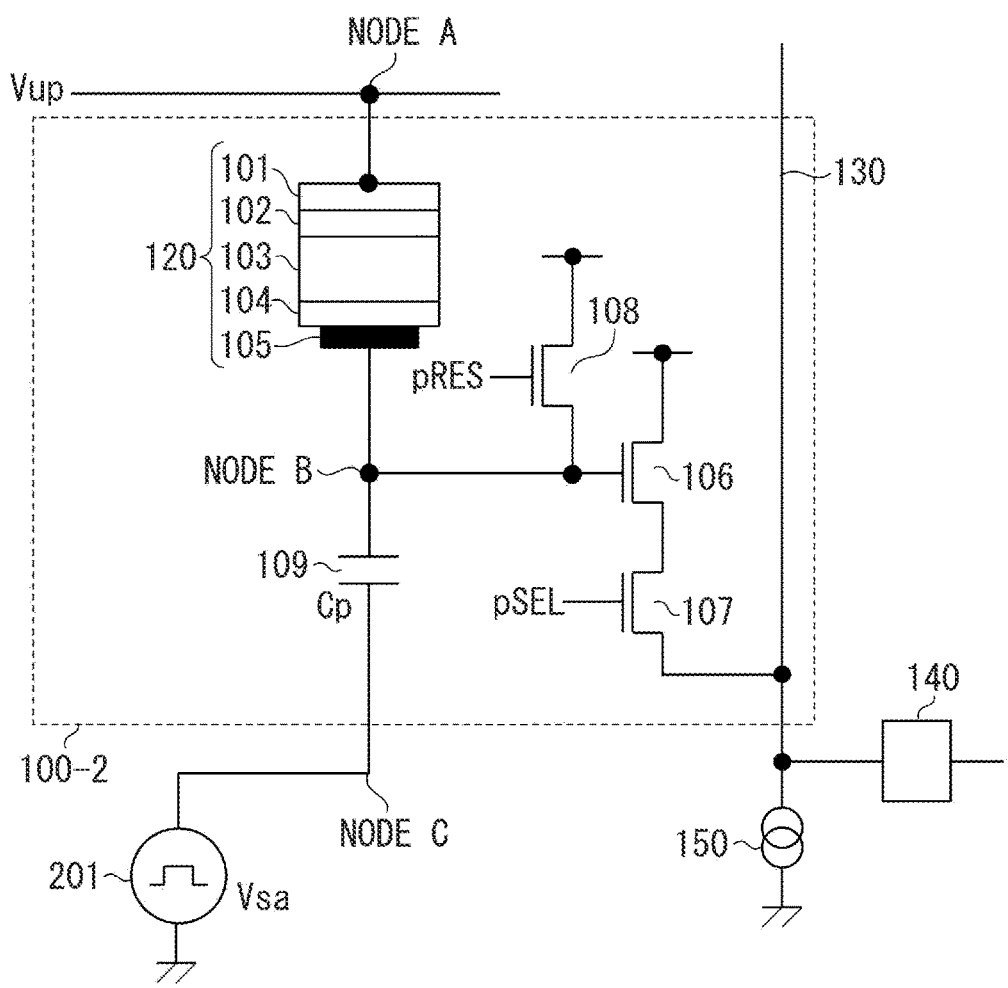
FIG. 10 illustrates a circuit configuration of a pixel.

FIG. 10 illustrates a configuration of a pixel 100-2 in the third exemplary embodiment. The entire configuration of the photoelectric conversion device according to the third exemplary embodiment is a configuration in which the pixel 100 is replaced by the pixel 100-2 in the configuration illustrated in FIG. 1.

As illustrated in FIG. 10, the pixel 100-2 in the third exemplary embodiment includes a capacitance Cp (109) having one end connected to the node B. The other node of the capacitance Cp (109) is connected to a node C, to which a voltage Vsa is supplied from the row drive circuit 201.

In the first exemplary embodiment, the row drive circuit 201 supplies the voltage Vs to the upper electrode 101. On the other hand, in the third exemplary embodiment, as illustrated in FIG. 10, the row drive circuit 201 supplies the voltage Vsa to the node C. Furthermore, the node A, to which the upper electrode 101 is connected, is supplied with a voltage Vup, which is a predetermined voltage, from a second voltage supply portion (not illustrated).

Also in the case of the third exemplary embodiment, during the photoelectric conversion mode, the row drive circuit 201 sets the level of the voltage Vsa to a voltage which causes the photoelectric conversion layer 103 to enter the reverse bias state. Moreover, during the mode B, the row drive circuit 201 sets the level of the voltage Vsa in such a manner that the voltage Vb is in a range that causes the photoelectric conversion layer 103 to enter the forward bias state and is in a range lower than the rising voltage Vf. With this, as in the first exemplary embodiment, the photoelectric conversion device according to the third exemplary embodiment is also able to perform the photoelectric conversion and the electronic shutter operation.

Furthermore, also in the photoelectric conversion device according to the third exemplary embodiment, the photoelectric conversion unit 120 includes the first blocking layer 104. Therefore, the photoelectric conversion device according to the third exemplary embodiment also has an effect capable of preventing a decrease in contrast of an image, which would occur in a conventional electronic shutter operation.

A photoelectric conversion device according to a fourth exemplary embodiment is described with reference to FIG. 11 mainly about portions different from those in the first exemplary embodiment.

The configuration of the photoelectric conversion device according to the fourth exemplary embodiment can be the same as that illustrated in FIG. 1.

Figure 11:
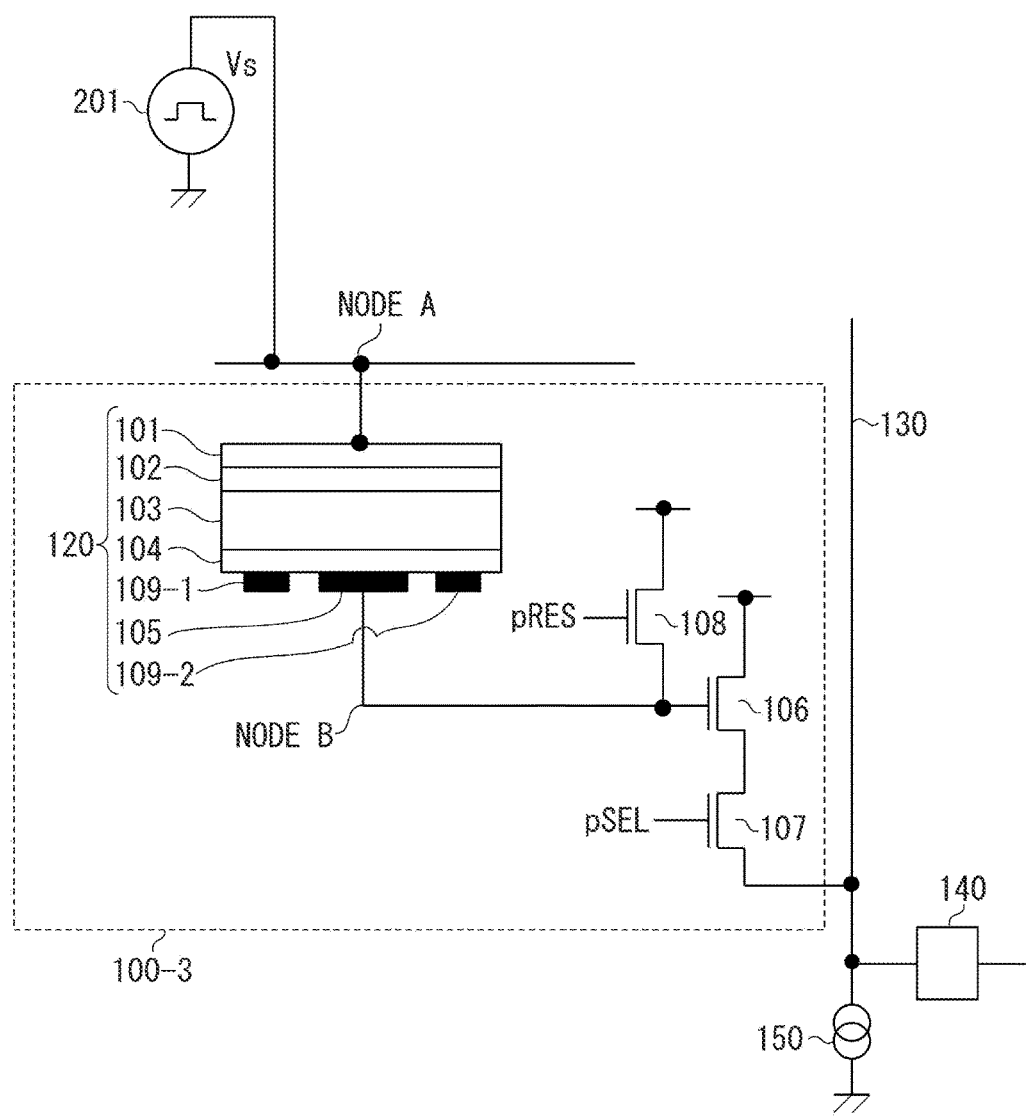
FIG. 11 illustrates a circuit configuration of a pixel.

FIG. 11 illustrates a configuration of a pixel 100-3 in the fourth exemplary embodiment. In the members illustrated in FIG. 11, members having the same functions as the members illustrated in FIG. 3A are assigned the respective same reference characters as those assigned in FIG. 3A. The pixel 100-3 in the fourth exemplary embodiment further includes auxiliary electrodes 109-1 and 109-2 in addition to the pixel electrode 105.

In a case where the photoelectric conversion unit 120 is in the mode B (an electronic shutter operation), both the auxiliary electrodes 109-1 and 109-2 are supplied with a predetermined drain voltage from a drain power source (not illustrated). In a case where signal electric charge is electrons, the drain voltage is set to a value larger than 0 V. On the other hand, in a case where signal electric charge is holes, the drain voltage is set to a value smaller than 0 V.

Therefore, during a period in which the photoelectric conversion unit 120 is in the mode B, electric charge opposite in polarity to signal electric charge drifting from the photoelectric conversion unit 120 toward the pixel electrode 105 is attracted to the auxiliary electrodes 109-1 and 109-2. With this, electric charge opposite in polarity to signal electric charge is ejected from the auxiliary electrodes 109-1 and 109-2. This enables preventing combination of signal electric charge accumulated in the pixel electrode 105 and electric charge opposite in polarity to the signal electric charge. Accordingly, the photoelectric conversion unit 120 including the auxiliary electrodes 109-1 and 109-2 enables the photoelectric conversion device according to the fourth exemplary embodiment to have an effect capable of precisely reading out signal electric charge accumulated in the pixel electrode 105.

A photoelectric conversion device according to a fifth exemplary embodiment is described with reference to FIG. 12 and FIGS. 13A and 13B mainly about portions different from those in the first exemplary embodiment.

Figure 12:
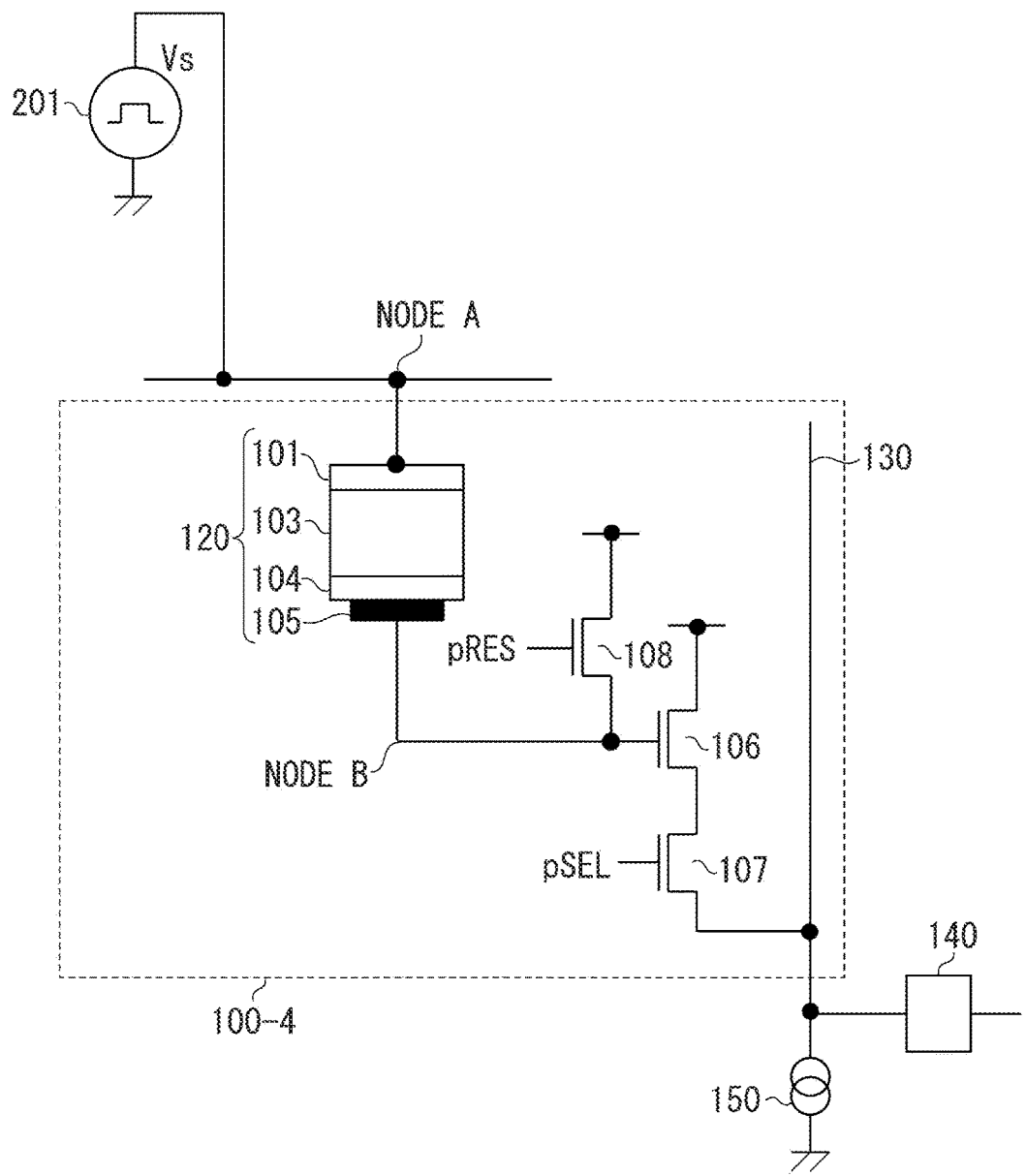
FIG. 12 illustrates a circuit configuration of a pixel.

FIG. 12 illustrates a configuration of a pixel 100-4 included in the photoelectric conversion device according to the fifth exemplary embodiment. In the members illustrated in FIG. 12, members having the same functions as the members illustrated in FIG. 3A are assigned the respective same reference characters as those assigned in FIG. 3A.

The pixel 100-4 in the fifth exemplary embodiment is not provided with the second blocking layer 102, which is included in the photoelectric conversion unit 120 illustrated in FIG. 3A, and, instead, is provided with a Schottky barrier between the upper electrode 101 and the photoelectric conversion layer 103. This Schottky barrier serves the same function as that of the second blocking layer 102 included in the photoelectric conversion unit 120 illustrated in FIG. 3A. Thus, in the fifth exemplary embodiment, the Schottky barrier serves as a second blocking unit configured to prevent injection of electrons, which are electric charge equal in polarity to signal electric charge, from the upper electrode 101 into the photoelectric conversion layer 103.

Figure 13A:
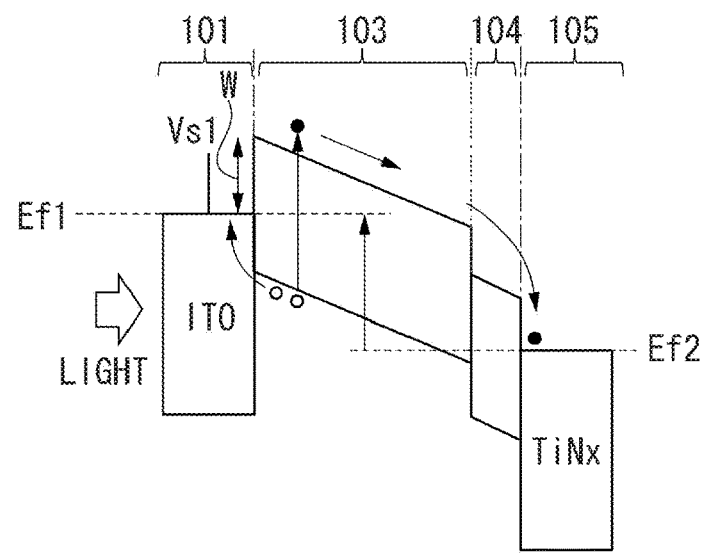
FIGS. 13A and 13B illustrate energy band states in an operation of a photoelectric conversion unit.
Figure 13B:
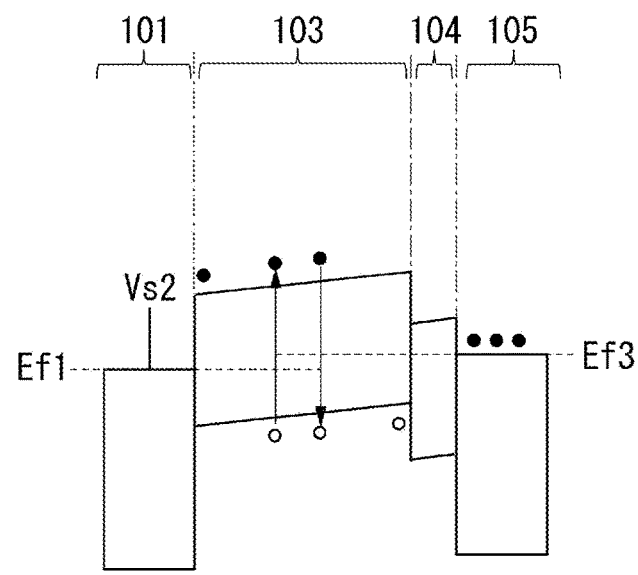

FIGS. 13A and 13B schematically illustrate potentials about energy bands and bias voltages to be applied in the photoelectric conversion unit 120 in the fifth exemplary embodiment. FIG. 13A is associated with the photoelectric conversion mode indicated in FIG. 6, and FIG. 13B is associated with the mode B indicated in FIG. 6.

FIGS. 13A and 13B illustrate energy bands of the upper electrode 101, the photoelectric conversion layer 103, the first blocking layer 104, and the pixel electrode 105.

In the fifth exemplary embodiment, the photoelectric conversion unit 120 is not provided with the second blocking layer 102, and, instead, is provided with a Schottky barrier W between the upper electrode 101 and the photoelectric conversion layer 103. With this, in the photoelectric conversion mode illustrated in FIG. 13A, the photoelectric conversion unit 120 prevents (blocks) signal electric charge (also assumed to be electrons in the fifth exemplary embodiment) from being injected from the upper electrode 101 into the photoelectric conversion layer 103.

Furthermore, the first blocking layer 104, which has an energy barrier with respect to holes serving as electric charge opposite in polarity to signal electric charge, is provided between the photoelectric conversion layer 103 and the pixel electrode 105. In the photoelectric conversion mode illustrated in FIG. 13A, as in the first exemplary embodiment, the first blocking layer 104 prevents (blocks) holes from being injected from the pixel electrode 105 into the photoelectric conversion layer 103. Furthermore, in the mode B illustrated in FIG. 13B, holes may drift from the photoelectric conversion layer 103 toward the pixel electrode 105 according to the applied bias. However, the first blocking layer 104 having an energy barrier with respect to holes prevents (blocks) holes from being injected from the photoelectric conversion layer 103 into the pixel electrode 105. Accordingly, as with the photoelectric conversion device according to the first exemplary embodiment, the photoelectric conversion device according to the fifth exemplary embodiment also has an effect capable of preventing a decrease in contrast of an image, which would occur in a conventional electronic shutter operation.

A photoelectric conversion device according to a sixth exemplary embodiment is described with reference to FIGS. 14A and 14B mainly about portions different from those in the first exemplary embodiment.

The configuration of the pixel 100 in the sixth exemplary embodiment can be the same as that illustrated in FIG. 3A. Moreover, the configuration of the photoelectric conversion device according to the sixth exemplary embodiment can be the same as that illustrated in FIG. 1.

Figure 14A:
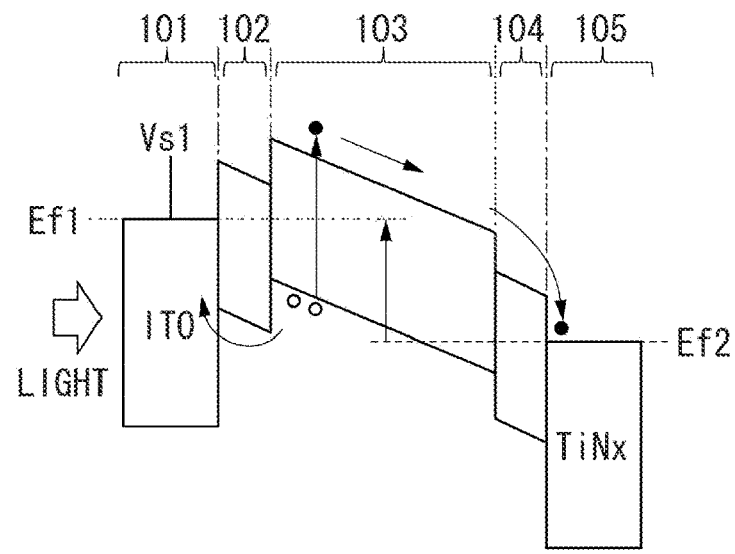
FIGS. 14A and 14B illustrate energy band states in an operation of a photoelectric conversion unit.
Figure 14B:
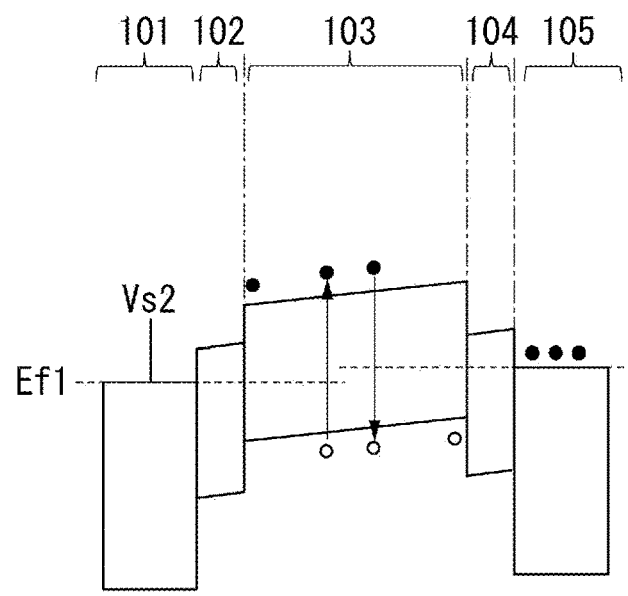

FIGS. 14A and 14B schematically illustrate potentials about energy bands and bias voltages to be applied in the photoelectric conversion unit 120 in the sixth exemplary embodiment. FIG. 14A is associated with the photoelectric conversion mode indicated in FIG. 6, and FIG. 14B is associated with the mode B indicated in FIG. 6.

FIGS. 14A and 14B illustrate energy bands of the upper electrode 101, the second blocking layer 102, the photoelectric conversion layer 103, the first blocking layer 104, and the pixel electrode 105.

In the sixth exemplary embodiment, the photoelectric conversion unit 120 includes the second blocking layer 102, which prevents injection of electric charge opposite in polarity to signal electric charge (being also electrons in the sixth exemplary embodiment), between the upper electrode 101 and the photoelectric conversion layer 103. As illustrated in FIGS. 14A and 14B, the sixth exemplary embodiment differs from the first exemplary embodiment in that the potential of the second blocking layer 102 with respect to signal electric charge is lower than that of the photoelectric conversion layer 103.

As in the first exemplary embodiment, the photoelectric conversion unit 120 includes the first blocking layer 104 between the photoelectric conversion layer 103 and the pixel electrode 105. As illustrated in FIGS. 14A and 14B, the potential of the first blocking layer 104 with respect to each of the photoelectric conversion layer 103 and the pixel electrode 105 is the same as that in the first exemplary embodiment.

The sixth exemplary embodiment is characterized in that a reverse-connected diode structure is formed of a configuration including the second blocking layer 102, the photoelectric conversion layer 103, and the first blocking layer 104.

In the sixth exemplary embodiment, an energy barrier with respect to signal electric charge is formed between the upper electrode 101 and the photoelectric conversion layer 103 via the second blocking layer 102. With this, in the photoelectric conversion mode illustrated in FIG. 14A, signal electric charge is prevented (blocked) from being injected from the upper electrode 101 into the photoelectric conversion layer 103.

Furthermore, the first blocking layer 104, which has an energy barrier with respect to holes serving as electric charge opposite in polarity to signal electric charge, is provided between the photoelectric conversion layer 103 and the pixel electrode 105. In the photoelectric conversion mode illustrated in FIG. 14A, as in the first exemplary embodiment, the first blocking layer 104 prevents (blocks) holes from being injected from the pixel electrode 105 into the photoelectric conversion layer 103. Furthermore, in the mode B illustrated in FIG. 14B, holes may drift from the photoelectric conversion layer 103 toward the pixel electrode 105 according to a bias applied to the photoelectric conversion layer 103. However, the first blocking layer 104 prevents (blocks) holes from being injected from the photoelectric conversion layer 103 into the pixel electrode 105.

In the photoelectric conversion mode, the photoelectric conversion layer 103 is in a depletion state due to the applied reverse bias. Electrons, which are signal electric charge, generated by the photoelectric conversion layer 103 are accumulated in the pixel electrode 105.

In the electronic shutter operation, to end the electric charge accumulation period of the photoelectric conversion layer 103, the band structure thereof is set to a structure close to a flat band. Electrons generated by the photoelectric conversion layer 103 recombine with holes inside the photoelectric conversion layer 103. Therefore, the electrons generated by the photoelectric conversion layer 103 are not accumulated in the pixel electrode 105.

The photoelectric conversion device according to the sixth exemplary embodiment is configured in an energy band structure in which the injection of holes from the upper electrode 101 into the photoelectric conversion layer 103 is more prevented during the mode B than in the first exemplary embodiment. With this, even when, in the mode B, the electric potential of the upper electrode 101 becomes lower than that of the pixel electrode 105, the injection of holes from the upper electrode 101 into the photoelectric conversion layer 103 can be more prevented than when the energy band state of the photoelectric conversion layer 103 is a complete flat band state. This effect is further described with reference to FIG. 14B. When the voltage Vs2 is set in such a manner that a pixel 100 on which low-luminance light is incident enters the flat band state during the mode B illustrated in FIG. 14B, the potential of the upper electrode 101 becomes lower with respect to electrons than that of the pixel electrode 105 in a pixel 100 on which high-luminance light is incident. Even in this case, since the energy band of the second blocking layer 102 is set lower with respect to electrons than that of the photoelectric conversion layer 103, the photoelectric conversion device according to the sixth exemplary embodiment is able to prevent the injection of holes from the upper electrode 101 into the photoelectric conversion layer 103. With this, the injection of holes from the photoelectric conversion layer 103 into the pixel electrode 105 can be more appropriately prevented than in the first exemplary embodiment. Accordingly, the photoelectric conversion device according to the sixth exemplary embodiment has an effect capable of more preventing a decrease in contrast of an image than the photoelectric conversion device in the first exemplary embodiment.

Figure 15:
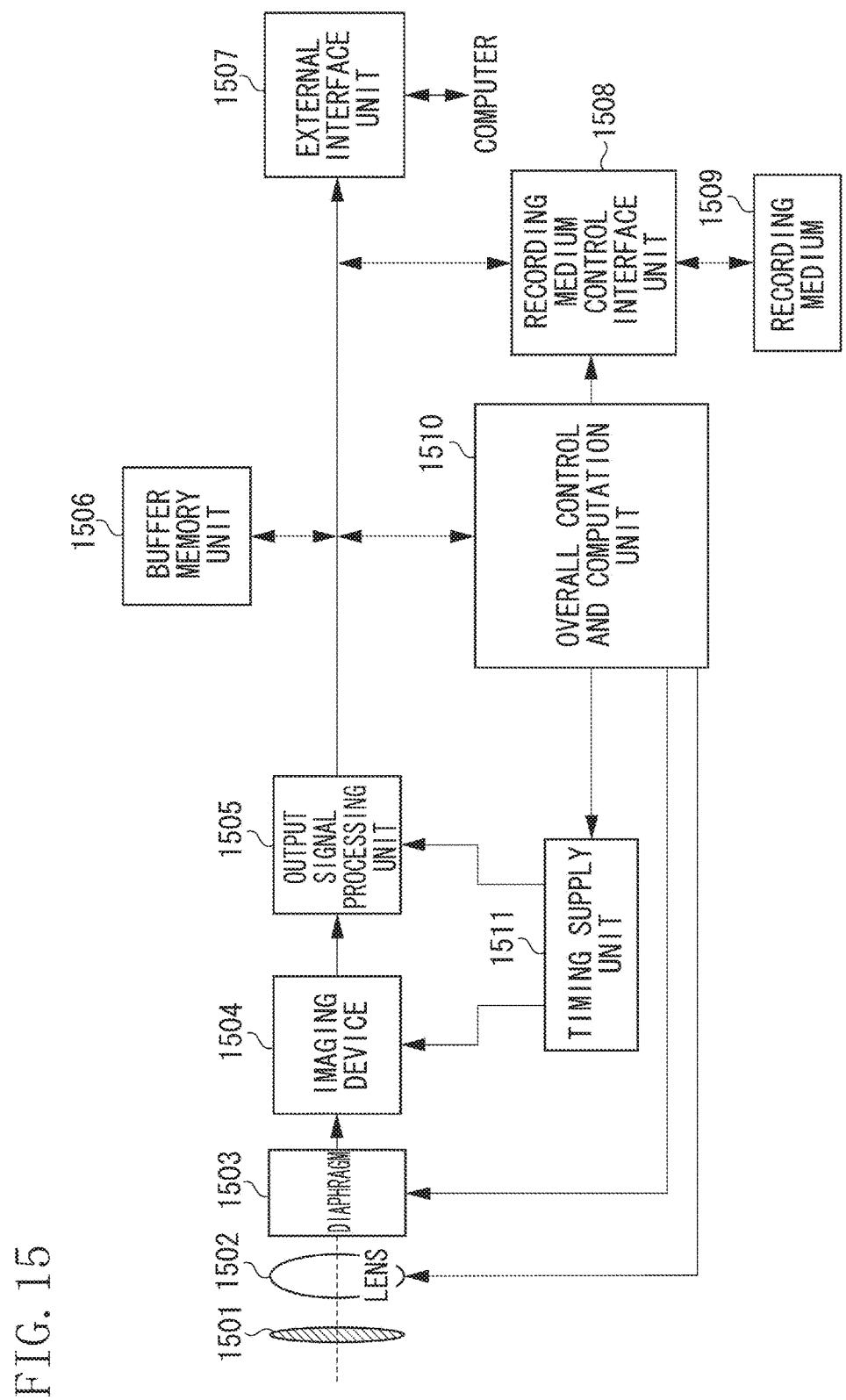
FIG. 15 illustrates a configuration of an imaging system.

An imaging system according to a seventh exemplary embodiment is described. Examples of the imaging system include a digital still camera, a digital camcorder, a camera head, a copying machine, a facsimile machine, a mobile phone, a vehicle-mounted camera, and an observation satellite. FIG. 15 is a block diagram of a digital still camera taken as an example of the imaging system.

The seventh exemplary embodiment is directed to an imaging system including a photoelectric conversion device in any one of the above-described exemplary embodiments as an imaging device 1504.

The imaging system illustrated as an example in FIG. 15 includes a barrier 1501, which is used for lens protection, a lens 1502, which forms an optical image of an object on the imaging device 1504, and a diaphragm 1503, which varies the amount of light passing through the lens 1502. The lens 1502 and the diaphragm 1503 configure an optical system which focuses light on the imaging device 1504. Moreover, the imaging system illustrated as an example in FIG. 15 further includes an output signal processing unit 1505, which performs processing on an output signal output from the imaging device 1504. The output signal processing unit 1505 performs an operation to perform various corrections and compressions as appropriate to output a signal.

The output signal processing unit 1505 performs an operation to generate an image using signals output from the imaging device 1504.

The imaging system illustrated as an example in FIG. 15 further includes a buffer memory unit 1506, which temporarily stores image data, and an external interface unit 1507, which performs communication with, for example, an external computer. The imaging system further includes a removable recording medium 1509, such as a semiconductor memory, which performs recording or reading of captured image data, and a recording medium control interface unit 1508, which performs recording or reading on the recording medium 1509. Moreover, the imaging system further includes an overall control and computation unit 1510, which controls various computations and the entire digital still camera, and a timing supply unit 1511, which outputs various timing signals to the imaging device 1504 and the output signal processing unit 1505. Here, for example, the timing signals can be input from the outside, and the imaging system includes at least the imaging device 1504 and the output signal processing unit 1505, which processes signals output from the imaging device 1504.

The overall control and computation unit 1510 operates as a control unit which adjusts the level of the voltage Vs2 described in each exemplary embodiment according to a set exposure condition. For example, the overall control and computation unit 1510 sets the level of the voltage Vs2 in such a manner that the photoelectric conversion unit 120 of the pixel 100 taking an intermediate value in the dynamic range of an image in the set exposure condition enters a flat band state. With this, the imaging device 1504 to which the photoelectric conversion device in each exemplary embodiment is applied is able to adequately perform the mode B according to an exposure condition.

Furthermore, in each pixel 100, a first photoelectric conversion unit 120A and a second photoelectric conversion unit 120B can be provided in pairs with respect to one microlens. The output signal processing unit 1505 processes a signal which is based on electric charge generated by the first photoelectric conversion unit 120A and a signal which is based on electric charge generated by the second photoelectric conversion unit 120B. With this, the imaging system is able to acquire distance information from the imaging device 1504 to an object. Furthermore, many more photoelectric conversion units can be provided with respect to one microlens. In other words, the output signal processing unit 1505 can acquire distance information from the imaging device 1504 to an object using a signal which is based on electric charge generated by some photoelectric conversion units of a plurality of photoelectric conversion units provided in association with one microlens and a signal which is based on electric charge generated by the other photoelectric conversion units. In this case, the signal which is based on electric charge generated by the other photoelectric conversion units can be obtained by subtracting the signal which is based on electric charge generated by some photoelectric conversion units from a signal which is based on the sum of electric charges generated by the plurality of photoelectric conversion units.

The output signal processing unit 1505 is provided on a second semiconductor substrate different from a first semiconductor substrate on which the imaging device 1504 is formed. The first semiconductor substrate and the second semiconductor substrate can be formed as respective separate chips or can be stacked in layers as a single chip.

Furthermore, an example in which the photoelectric conversion device used as the imaging device 1504 includes the AD conversion unit 204 has been described. As another example, the AD conversion unit 204 can be included in the output signal processing unit 1505. In this case, the imaging device 1504 is configured to output an analog signal to the output signal processing unit 1505.

As described above, the imaging system according to the seventh exemplary embodiment is able to perform an image capturing operation by application of the imaging device 1504.

Furthermore, each of the above-described exemplary embodiments is merely a specific example taken to implement the disclosure, and should not be construed to limit the technical scope of the disclosure. In other words, the aspects of the embodiments can be implemented in various manners without departing from the technical idea thereof or the principal characteristics thereof. Moreover, some or all of the above-described exemplary embodiments can be combined in various manners to implement the disclosure.

According to exemplary embodiments of the disclosure, a photoelectric conversion device having a configuration enabling an appropriate electronic shutter operation can be provided.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-233211 filed Nov. 30, 2016, which is hereby incorporated by reference herein in its entirety.

What is claimed is:

1. A photoelectric conversion device comprising a semiconductor substrate and a pixel,
wherein the pixel includes:
a first electrode unit;
a second electrode unit located between the first electrode unit and the semiconductor substrate;
a photoelectric conversion layer located between the first electrode unit and the second electrode unit;
a blocking unit located between the photoelectric conversion layer and the second electrode unit and configured to cause electric charge having a first polarity to be injected from the photoelectric conversion layer into the second electrode unit and to prevent electric charge having a second polarity opposite to the first polarity from being injected from the photoelectric conversion layer into the second electrode unit; and
a voltage supply unit configured to supply a first voltage to one of the first electrode unit and the second electrode unit such that electric charge having the first polarity is injected from the photoelectric conversion layer into the second electrode unit, and configured to supply a second voltage to the one of the first electrode unit and the second electrode unit such that electric charge having the first polarity is prevented from being injected from the photoelectric conversion layer into the second electrode unit.

2. The photoelectric conversion device according to claim 1, wherein an energy band of the blocking unit is lower in potential with respect to electric charge having the first polarity and higher in potential with respect to electric charge having the second polarity than an energy band of the photoelectric conversion layer.

3. The photoelectric conversion device according to claim 1, wherein the pixel further includes a second blocking unit located between the photoelectric conversion layer and the first electrode unit and configured to prevent electric charge having the first polarity from being injected from the first electrode unit into the photoelectric conversion layer.

4. The photoelectric conversion device according to claim 2, wherein the pixel further includes a second blocking unit located between the photoelectric conversion layer and the first electrode unit and configured to prevent electric charge having the first polarity from being injected from the first electrode unit into the photoelectric conversion layer.

5. The photoelectric conversion device according to claim 1, wherein the first electrode unit, the photoelectric conversion layer, the second electrode unit, and the blocking unit form a photodiode.

6. The photoelectric conversion device according to claim 4, wherein the first electrode unit, the photoelectric conversion layer, the second electrode unit, and the blocking unit form a photodiode.

7. The photoelectric conversion device according to claim 1, wherein principal elements respectively used to form the blocking unit and the photoelectric conversion layer are equal.

8. The photoelectric conversion device according to claim 6, wherein principal elements respectively used to form the blocking unit and the photoelectric conversion layer are equal.

9. The photoelectric conversion device according to claim 7, wherein respective impurity concentrations of the blocking unit and the photoelectric conversion layer are different from each other.

10. The photoelectric conversion device according to claim 7, wherein respective conductivity types of the blocking unit and the photoelectric conversion layer are different from each other.

11. The photoelectric conversion device according to claim 1,
wherein the blocking unit is formed of a first semiconductor material, and
wherein the photoelectric conversion layer is formed of a second semiconductor material which principally contains an element different from a principal element used to form the first semiconductor material.

12. The photoelectric conversion device according to claim 6,
wherein the blocking unit is formed of a first semiconductor material, and
wherein the photoelectric conversion layer is formed of a second semiconductor material which contains an element different from an element used to form the first semiconductor material.

13. The photoelectric conversion device according to claim 11, wherein the blocking unit and the photoelectric conversion layer form a heterojunction.

14. The photoelectric conversion device according to claim 1,
wherein the pixel includes a plurality of pixels,
wherein the first electrode unit is formed over the plurality of pixels.

15. The photoelectric conversion device according to claim 6,
wherein the pixel includes a plurality of pixels,
wherein the first electrode unit is formed over the plurality of pixels.

16. An imaging system comprising:
the photoelectric conversion device according to claim 1; and
a signal processing unit configured to generate an image by processing a signal output from the photoelectric conversion device.

17. The imaging system according to claim 16, further comprising a control unit configured to change the second voltage based on a signal level of the signal output from the photoelectric conversion device.

18. The imaging system according to claim 16, wherein a semiconductor substrate on which the photoelectric conversion device is provided and a semiconductor substrate on which the signal processing unit is provided are stacked in layers.

19. The imaging system according to claim 17, wherein a semiconductor substrate on which the photoelectric conversion device is provided and a semiconductor substrate on which the signal processing unit is provided are stacked in layers.

20. The imaging system according to claim 16,
  wherein the pixel includes a plurality of photoelectric conversion units, each including the first electrode unit, the second electrode unit, the photoelectric conversion layer, and the blocking unit, and one microlens provided in association with the plurality of photoelectric conversion units, and
  wherein the signal processing unit acquires distance information about an object using a signal which is based on electric charge having the first polarity output from some photoelectric conversion units of the plurality of photoelectric conversion units and a signal which is based on electric charge having the first polarity output from the other photoelectric conversion units of the plurality of photoelectric conversion units.

* * * * *